United States Patent [19]

Isoda et al.

[11] Patent Number: 5,883,397

[45] Date of Patent: Mar. 16, 1999

[54] PLASTIC FUNCTIONAL ELEMENT

[75] Inventors: Satoru Isoda; Hiroaki Kawakubo; Satoshi Nishikawa; Kouichi Akiyama, all of Hyogo, Japan

[73] Assignee: Mitsubishi Denki Kabushiki Kaisha, Tokyo, Japan

[21] Appl. No.: 862,741

[22] Filed: May 23, 1997

Related U.S. Application Data

[63] Continuation of Ser. No. 265,248, Jun. 24, 1994, abandoned.

[30] Foreign Application Priority Data

Jul. 1, 1993 [JP] Japan ..................................... 5-163526

[51] Int. Cl.$^6$ .......................... H01L 35/24; H01L 51/100
[52] U.S. Cl. .............................. 257/40; 257/79; 257/184; 257/225; 257/414
[58] Field of Search ............................... 257/40, 79, 184, 257/192, 225, 414, 429, 431

[56] References Cited

U.S. PATENT DOCUMENTS

| | | | |
|---|---|---|---|
| 4,783,605 | 11/1988 | Tomisawa et al. | 307/405 |
| 4,902,555 | 2/1990 | Isoda et al. | 428/195 |
| 5,010,451 | 4/1991 | Ueyama et al. | 361/504 |
| 5,211,762 | 5/1993 | Isoda et al. | 136/263 |
| 5,349,203 | 9/1994 | Hanazato et al. | 257/40 |

OTHER PUBLICATIONS

10th Symposium on Future Electron Devices "Fractal Time Response of Molecular Assemblies and Possible Applications", Saito et al., Oct. 1991. pp. 107–110.

IEICE Trans. Fundamentals "Non–integer Exponents in Electronic Circuits: F–Matrix Representation of the Power–Law Conductivity" Chenical Physics Letters Excitation Energy Relaxation of Rhoda–mine B in Languir–Blodgett Monolayer Films: Picosecond Time–Resolved Fluorescence Studies, Tamai et al., vol. 147, No. 2, May 1988, pp. 25–29. vol. E75–A, No. 6, Jun. 1992, Sugi et al., pp. 720–725.

*Primary Examiner*—Carl Whitehead, Jr.
*Attorney, Agent, or Firm*—Wolf, Greenfield & Sacks, P.C.

[57] ABSTRACT

A plastic functional element comprising a lower electrode and a transparent upper electrode provided perpendicular to the contact surface between a first oxidation reduction material membrane and a second oxidation reduction material membrane, the oxidation reduction potentials of which being different each other, wherein, based on the difference in oxidation reduction potentials between the oxidation reduction material membranes, by irradiating light to the contact surface or applying a voltage between the electrodes, the condition of electron in the oxidation reduction material is controlled, so as to store information of incident light or applied voltage, and an operational function responding to an input voltage is given, thereby the minimization in size is possible to realize a high density and high speed operation.

110 Claims, 13 Drawing Sheets

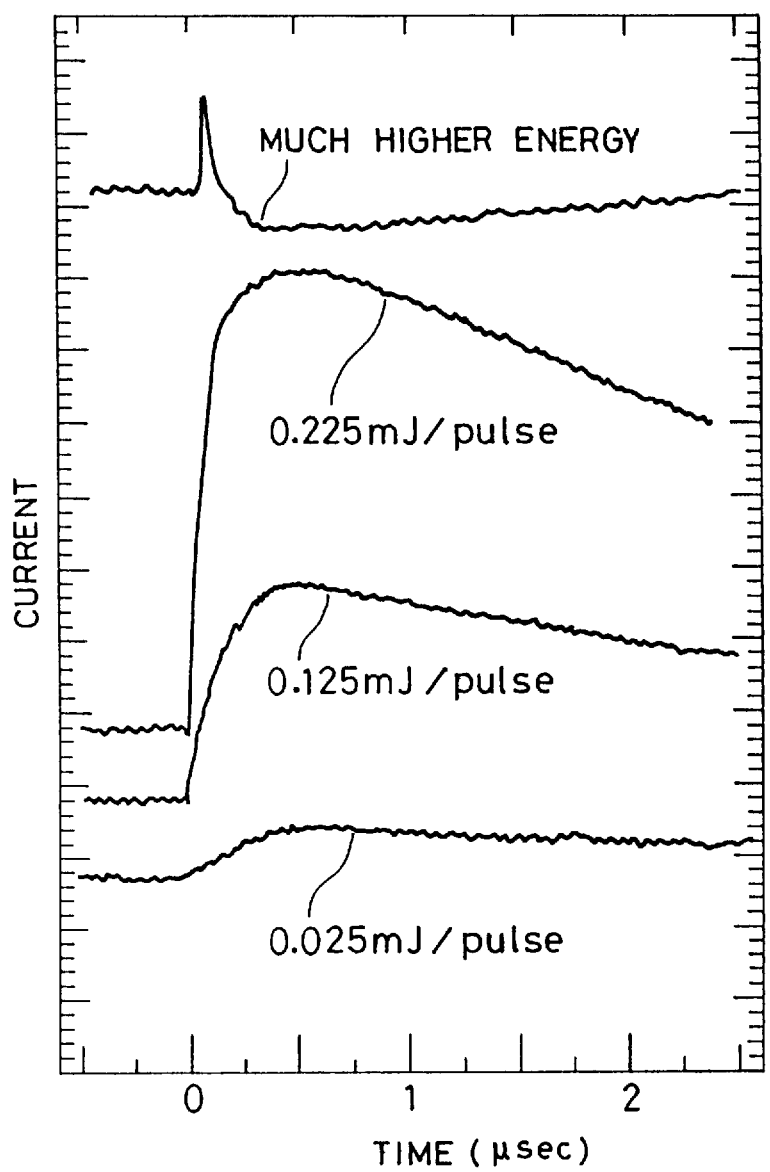

$i(t) = i_0(S) t^{-\alpha}$

| $i_0(S)$ | $\alpha$ |
|---|---|
| -0.062 | 0.401 |
| -0.027 | 0.399 |
| -0.006 | 0.434 |
| 0.002 | 0.226 |

$i(t) = i_0(S) t^{-\alpha}$

| $i_0(S)$ | $\alpha$ |
|---|---|
| -3.35 | 0.048 |
| -3.32 | 0.099 |
| -3.45 | 0.286 |
| -3.05 | -0.105 |

PLASTIC FUNCTIONAL ELEMENT

This application is a continuation of application Ser. No. 08/265,248, filed Jun. 24, 1994 now abandoned.

BACKGROUND OF THE INVENTION (1) Field of the Invention

The present invention relates to a plastic functional element having memory function and operational function controlled by at least one of light and electric field, and more particularly to an organic memory element and organic operational element.

(2) Description of the Prior Art

In the field of an element comprising an organic membrane provided with a memory function and a switching function controllable by both light irradiation and electric field, elements which is based on insulator-metal transition resulting from doping of conducting polymer has been already invented and established. In this case, as the method for controlling doping process by light or electric field, an electro-chemical method using solid electrolyte or electrolyte aqueous solution or optical dissociation of solid electrolyte can be used. Then the conducting polymer can be used for a memory element and a switching element based on remarkable change in the absorption spectra and conductivity due to insulator-metal transition by doping.

FIG. 1 shows an example for describing the structure of the above mentioned organic optical memory element or the organic optical switching element based on doping to conducting polymer proposed by Katsumi Yoshino et al on Japanese Journal of Applied Physics, vol. 24, p. L373, 1985.

In the figure, the electrode 1 comprising an Indium-Tin coated glass plate, a conducting polymer membrane 2 of polyacetylene, a polymer matrix membrane 13 of polystyrene or the like containing triphenylsulfonium hexafluoroarsenate salt or the like, and a transparent electrode 4 comprising Indium-Tin coated quartz plate are shown.

Then the operation of this type of element shown in FIG. 1 is described. Upon the irradiation of light 5 with the wave length ranging from visible to ultraviolet from a Hg lamp onto the element, triphenylsulfonium hexafluoroarsenate salt contained in the polymer membrane 3 is optically dissociated, hexafluoroarsenate ions are doped on the polyacetylene in the conducting polymer membrane 2, and color changes from red to blue. The blue color is maintained for three months or more under an open circuit condition in air. By applying a negative bias voltage (1.2 V) on the polyacetylene of the conducting polymer membrane 2, the hexafluoroarsenate ions doped in the polyacetylene are electrochemically dissociated and the color turns to red again. Based on this mechanism, the element can be used as an erasable optical memory.

Then by applying a positive bias voltage on the conducting polymer membrane 2 of polyacetylene, triphenylsulfonium hexafluoroarsenate salt in the polymer membrane 3 is electrically dissociated to dope hexafluoroarsenate ions in the conducting polymer membrane 2 of polyacetylene, and the color changes from red to blue. By short-circuiting or applying a negative bias voltage on the conducting polymer membrane 2 of polyacetylene, the color changes from blue to red on the same reason as mentioned above. Based on this mechanism, a switching element controllable with light irradiation and electric field is provided.

Because the conventional organic memory element or the organic switching element is based on the doping of carriers caused from ion transfer as described above, the writing and reading time is limited when this element is used as a memory element and the switching time for a switching element is limited. In addition, since this type of element can not be made small in size due to the material properties of polymer, the element has some limitation to use for an integrated circuit due to these difficulties.

SUMMARY OF THE INVENTION

Addressing on the solution of above mentioned problems, an object of this invention is to provide a plastic functional element, particularly an organic memory element or an organic operational element of small size with high density and high speed operation, based on inter molecular electron transfer for doping carriers controllable with light irradiation or voltage application and based on use of monomolecular membrane technology.

In order to achieve the above mentioned purpose, according to the first aspect of the invention, there is provided a plastic functional element comprising, a first oxidation reduction material membrane comprised of a first oxidation reduction material, a second oxidation reduction membrane in contact with the first oxidation reduction membrane and comprised of a second oxidation reduction material having a different oxidation reduction potential from the first oxidation reduction material, a first electrode in contact with the first oxidation reduction material membrane, and a second electrode in contact with the second oxidation reduction material membrane, the first and the second oxidation reduction membranes being sandwiched between the first and the second electrodes, to controllably maintain the electron condition in at least one of the first and the second oxidation reduction material in a changed condition for a certain period of time by at least one of light irradiation and voltage application based on the difference in oxidation reduction potential between the first and the second oxidation reduction materials.

As stated above, according to the first aspect of the present invention, by irradiation of light on the contact surface of two oxidation reduction material membranes having different oxidation reduction potentials or by applying a voltage between the lower electrode and transparent upper electrode, both provided perpendicularly to the contact surface of said oxidation reduction material membranes, the generation and relaxation processes of carriers are controlled. Accordingly electron condition in at least one of the first and the second oxidation reduction material membranes can be controllably maintained in a changed condition (modulation) for a certain period of time. Because the mechanism is based on the inter molecular electron transfer controllable by light irradiation or voltage application to dope carriers and monomolecular membrane technology is used, the minimization in size, high density and high speed operation are possible.

According to the second aspect of the present invention, by controlling the electron condition in at least one of the first and the second oxidation reduction materials in the above mentioned plastic functional element, the time changing signal of input light or input voltage is stored, and a light pulse or a step voltage is used as a reading out signal.

The memory capacity of input information is controlled by controlling at least one of the wave length or intensity of irradiated light or applied voltage to control the electron condition in the first or the second oxidation reduction material.

The input information is erased by applying a voltage to enable the element to have repeated write in and read out capability.

The electron condition in the first or the second oxidation reduction material is controlled by applying a voltage between a source electrode and a drain electrode both provided apart on the contact surface of the first and the second oxidation reduction membranes.

As stated above, according to the second aspect of the present invention, by providing a lower electrode and a transparent upper electrode, for example, perpendicularly to the contact surface of two oxidation reduction material membranes having a different oxidation reduction potential and by irradiating light on the contact surface through the upper electrode, the generation and relaxation processes of carrier can be controlled to store information of incident light based on the change in the electron condition in at least one of the first and the second oxidation material membranes. In other way, by applying a voltage between the electrodes holding the above mentioned two oxidation reduction material membranes therebetween, the generation and relaxation process of carrier can be controlled as well to store information of applied voltage based on the change in the electron condition in at least one of the first and second oxidation reduction material membranes. In addition, an organic memory element which stores information of both incident light and applied voltage by irradiated light and applied voltage on the contact surface can be obtained.

By controlling wave length or intensity of light irradiation or by controlling the voltage applied between the electrodes, the generation and relaxation processes of the carrier can be controlled, and accordingly the electron condition in at least one of the first and the second oxidation reduction material membranes can be controlled.

By applying a voltage the carrier stored in the first or the second oxidation reduction material membrane is erased so that the input information is erased, enabling the element to have capability of rewriting. That is, the element has the capability of repeated writing in and reading out cycle of input information.

The generation and relaxation processes of the carrier can be controlled by applying a voltage between the source electrode and the drain electrode both provided apart on the contact surface of the first and the second oxidation reduction membranes. The electron condition in the first or the second oxidation reduction material is changed to store more information of incident light and applied voltage. That is, the element is provided with increased memory capacity.

According to the third aspect of the present invention, there is provided an organic operational element comprising, a first oxidation reduction material membrane comprised of a first oxidation reduction material, a second oxidation reduction membrane provided in contact with the first oxidation reduction membrane and comprised of a second oxidation reduction material having a different oxidation reduction potential from the first oxidation reduction material, a first electrode provided in contact with the first electrode, and a second electrode provided in contact with the second oxidation reduction material membrane, the first and the second oxidation reduction membranes being sandwiched between the first and the second electrodes, to control the electron condition in at least one of the first and the second oxidation reduction material membranes by at least one of light irradiation and voltage application based on the difference in oxidation reduction potential between the first and the second oxidation reduction materials, then provide an output of an operation with respect to time by using an input of a time changing voltage signal.

The operational function of the element is controlled by controlling at least one of the wave length or intensity of irradiated light or applied voltage to control the electron condition in the first or the second oxidation reduction material.

The input-output relationship of the operation can be erased by applying a voltage to provide the element with a capability of repeatedly outputting the results of operations responding to repeated inputs.

The electron condition in at least one of the first and the second oxidation reduction materials is controlled by applying a voltage between a source electrode and a drain electrode both provided apart on the contact surface of the first and the second oxidation reduction membranes.

The above mentioned organic memory element and organic operational element may comprise a plurality of the first oxidation reduction material membranes and the second oxidation reduction material membranes laminated alternately.

Monomolecular membranes or monomolecular membrane built-up films prepared by Langnmuir-Blodgett method or prepared by vacuum evaporation method or organic ICB method are used as the oxidation reduction material membranes of the element.

As stated above, according to the third aspect of the present invention, by providing the lower electrode and the transparent upper electrode perpendicularly, for example, to the contact surface of two oxidation reduction material membranes having different oxidation reduction potentials and by irradiating light on the contact surface through the upper electrode the generation and relaxation processes of carriers can be controlled thereby the invention provides an organic operational element having the capability of operational function with respect to an input voltage based on the change in electron condition in at least one of the first and the second oxidation reduction material membranes.

By controlling wave length or intensity of light irradiation or by controlling the voltage applied between the electrodes, the generation and relaxation processes of the carrier can be controlled, and accordingly the electron condition in at least one of the first and the second oxidation reduction material membranes can be controlled.

By applying a voltage, the carrier stored in the first or the second oxidation reduction material membrane is erased so that the input information is erased, enabling the element to have capability of rewriting. That is, the element has the capability of repeated writing in and reading out cycle of input information.

The generation and relaxation processes of carriers can be controlled by applying a voltage between the source electrode and the drain electrode both provided apart on the contact surface of the first and the second oxidation reduction material membranes. Thereby, the electron condition in at least one of the first and the second oxidation reduction materials is changed and the element has the capability of operational function responding to input voltage, and has enhanced operational functions. This operational element may be incorporated as a part of an electric circuit to operate differential operation and integration operation with non-integral rank, and furthermore by combining these operational circuits the differential and integration operations with infinite real number rank is possible.

In the above mentioned organic memory element or the organic operational element, by laminating alternately the first oxidation reduction material membranes and the second oxidation reduction material membranes, wherein for example, the thickness of the first and the second oxidation reduction material membranes is controlled in the unit of monomolecular membrane, accordingly to result a plurality of contact surfaces, the memory capacity of memory element is increased and the operational function of operational element is increased.

By forming the above mentioned oxidation reduction material membranes by Langnmuir-Blodgett method, the oxidation reduction material membrane is controlled in the unit of monomolecular membrane, and the organic memory element and organic operational element are provided with enhanced functions.

By preparing the above mentioned oxidation reduction material membranes by vacuum evaporation method or organic ICB method, the fine working of the membrane can be possible, thereby the organic memory element and organic operational element are provided with enhanced integration.

According to the fourth aspect of the present invention, there is provided an infinite real number rank differential and integration operation circuit comprising the above mentioned organic operational elements and RC circuits, in which the electron condition in the first or the second oxidation reduction material is controlled by at least one of light irradiation and voltage application and thereafter time changing voltage signal input are fed, to get output of differential or integration operation with infinite real number rank of time.

According to the fifth aspect of the present invention, there is provided a chaos signal generating element comprising the above mentioned organic memory element or organic operation element as a part of the electric circuit thereof which controls the generation and suppression of chaos signals by at least one of light irradiation and voltage application.

According to the sixth aspect of the present invention, there is provided an information processing system having information sorting function, memory function, or switching function using chaos signal from the above mentioned chaos element.

According to the seventh aspect of the present invention, there is provided an image memory element having the capability of image memory, image identification, and image information processing functions based on the use of one dimensional time changing light pulse or voltage pulse converted from image information as input signal fed to the above mentioned organic memory element.

The above and further objects and novel features of the invention will appear more fully from the following detailed description when the same is read in connection with the accompanying drawings. It is to be expressly understood, however, that the drawing is for purpose of illustration only and is not intended as a definition of the limits of the invention.

BRIEF DESCRIPTION OF THE DRAWINGS

FIG. 3 is a characteristic diagram showing the dependency of output current from organic memory element of an embodiment of the present invention on the number of incident light pulses;

DESCRIPTION OF THE PREFERRED EMBODIMENTS

Embodiment 1

An embodiment of organic memory element of the present invention is described hereunder referring to drawings.

Figure 1:
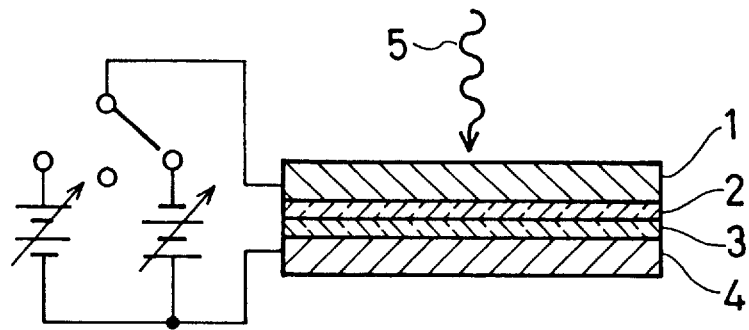
FIG. 1 is a structural diagram showing a conventional organic light memory element or organic light switching element.
Figure 2:
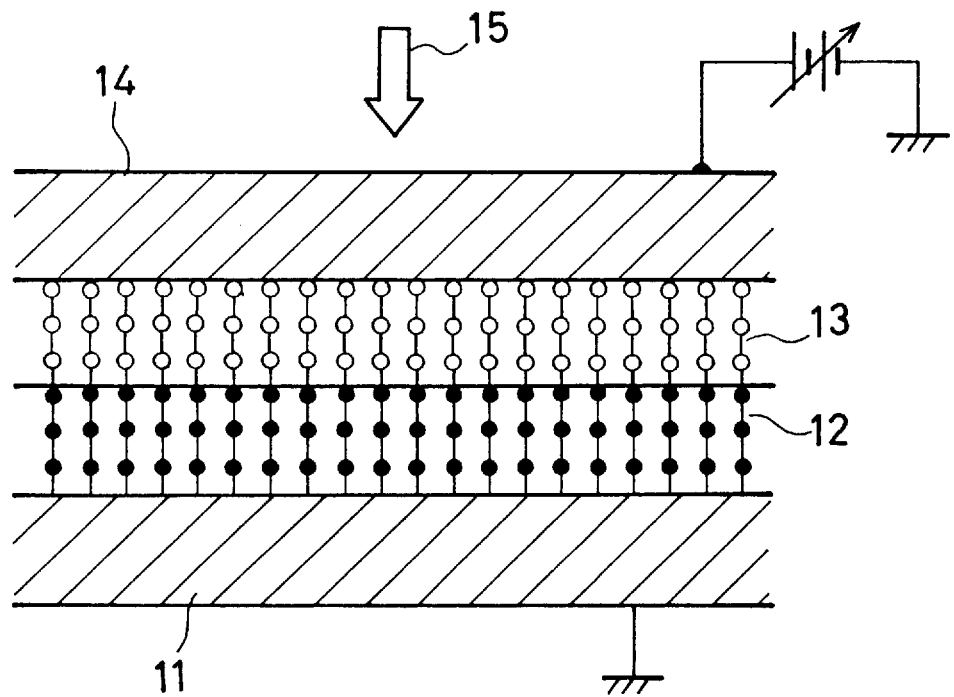
FIG. 2 is a cross sectional schematic diagram for illustrating the structure of an organic memory element according to an embodiment of the present invention.

FIG. 2 is a cross-sectional schematic diagram showing one example of the structure of a plastic functional element according to the present invention or one embodiment of an organic memory element of the present invention. In FIG. 2, a lower electrode 11, that is a first electrode, is comprised of conducting material of, for example, metal, a first oxidation reduction material membrane 12 (hereinafter referred to as a first molecular membrane) is comprised of a first oxidation reduction material formed on the lower electrode 11; a second oxidation reduction material membrane 13 (hereinafter referred to as a second molecular membrane) is comprised of a second oxidation reduction material membrane having an oxidation reduction potential different from that of the first oxidation reduction material used as the first molecular membrane 12, and is formed on the first molecular membrane 12; and a second electrode 14 is formed on the second molecular membrane 13, and in this case, is a transparent upper electrode. As the transparent upper electrode 14, typically, for example, a semitransparent aluminum electrode with a thickness of 10 nm or a transparent electrode of ITO (Indium-Tin oxide) is used. Light 15 is irradiated to the first molecular membrane 12 and the second molecular membrane 13 through the transparent upper electrode 14 from a light source outside.

The preparation of an element shown in FIG. 2 is described herein under.

By vacuum evaporation method, for example, an aluminum evaporated membrane with a thickness of 100 nm is formed as the lower electrode 11 on a substrate, and thereon for example, by Langmuir-Blodgett method (hereinafter referred to as LB method), nine layers of monomolecular membrane of hematoporphyrin(IX)-bis(tridecanoylether)Ru $(P(OCH_3)_3)_2Br$ (hereinafter referred to as $RuHP(ph)_2$) are formed, or by vacuum evaporation method, a $RuHP(ph)_2$ multi-layer membrane with a thickness of 20 nm is formed, or by organic ICB method, a $RuHP(ph)_2$ multi-layer membrane with a thickness of 20 nm is formed as the first molecular membrane 12 having a oxidation reduction potential.

On the first molecular membrane 12, ten layers of the second oxidation reduction material, as the second molecular membrane 13, with an oxidation reduction potential different from that of the first oxidation reduction material of $RuHP(ph)_2$, for example, 7,8-dimethyl-3,10-dinonyl isoalloxiazine (hereinafter referred to as DNI), is laminated by LB method. On the second molecular membrane 13, by evaporation method, aluminum is evaporated to form an aluminum membrane with a thickness of 10 nm as the upper electrode.

The operational mechanism of the element shown in FIG. 2 is described hereunder.

Pulse light 15, with wave length of 360 nm or 450 nm, that is an excitation wave length of DNI, with a half width of 6 n.sec, and with an intensity of 25 mJ/cm²·pulse, is irradiated through the upper electrode 14. Based on the internal electric field in the contact surface between the first molecular membrane 12 of $RuHP(ph)_2$ and the second molecular membrane 13 (hereinafter referred to as a hetero contact surface), the photo-excitation of DNI is caused initially and followed by the electric charge separation and electric charge transfer, and the generation of carrier is induced. Due to the wide distribution of relaxation time, the transient response of current can be expressed as a power function. That is, $$i(t) = i(0)t^{-a} \quad 0 < a < 1$$

where $$\log i(0) = \log i(t) + i'^2/(ii'' - i'^2)\log ii'/(i'^2 - ii'')$$

$$a = i'^2/(ii'' - i'^2)$$

The current initial value i(0) and power exponent a can be read out with the current value i(t) in the time area of the power function, the first order differential i'(t) and second order differential i"(t), and also can be read out by using three current values at three different points of time. The initial current value i(0) and the power exponent a have a close relation to the generation and relaxation mechanism of carrier induced from photo-excitation at the hetero contact surface, and are controlled by the intensity, the wave length of incident pulse light, and the timing.

FIG. 3 is an illustration of the dependency of initial current value on the intensity of incident light pulse. As shown in the figure, the initial current value increases with the increase of the intensity of incident light pulse. Based on this relation, a memory element having the capability of storing a time changing signal changed by light is provided.

Figure 4A:
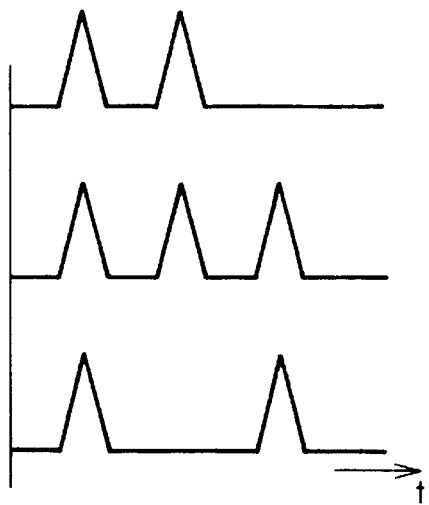
FIG. 4A and FIG. 4B are waveform diagrams illustrating two examples of input light pulses fed to organic memory element of the present invention.
Figure 4B:
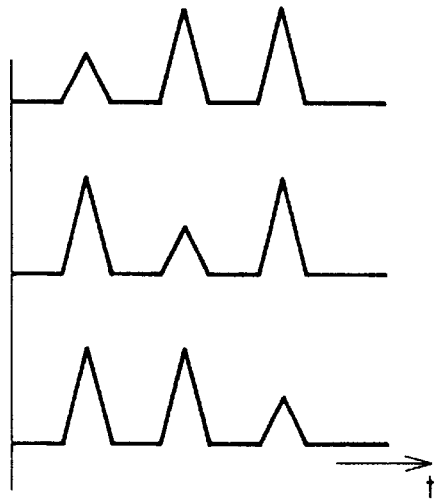

For instance, for the input of pulse light series having the same incident light intensity and different timings as shown in FIG. 4A, by using a reading signal of pulse light or step voltage under the same condition, the memory element provides current response with initial current value corresponding one-to-one to individual series pulse light as output, hence the identification of series pulse light is possible. Similarly for the input of pulse light series having the same incident timings and different intensities as waveforms shown in FIG. 4B, by using a reading signal of pulse light or step voltage under the same condition, the memory element provides output of current response with initial current value corresponding one-to-one to individual series pulse light, hence the identification of series pulse light is possible. Also, although it is not shown in the figure, for the input of pulse series having different wave lengths, based on the current response output with an initial current value corresponding one-to-one to individual series pulse light, the identification of series pulse light is possible.

By applying a voltage in the reverse direction against the internal electric field at the hetero contact surface, carriers stored in the hetero contact surface are erased, and erasing of memory is possible. Based on the erasability, a memory element having a capability of rewriting is provided.

The above mentioned embodiment 1 is described more particularly hereunder. In the present invention, the following two characteristics, which are not found in the photoelectric conversion at PN junction of conventional semiconductors.

The first characteristic is that, the relaxation process of carrier generated by light irradiation or voltage application can not be expressed as a single exponential function but represented with power function, that is the difference in the time response. This type of time response is known as a dispersion electric conductivity. In the system other than that of the present invention, this phenomenon is found in the system with disordered structure as amorphous silicon. As described above, based on the phenomenon, the initial current value and power exponent can be read out. The time constant of relaxation process of the carrier is within several ten micro second in the case of plastic functional element of the present invention.

The second characteristic is that, the generation process of carriers is modulated by irradiating light or applying a voltage. The modulation is due to the fact that the generation speed and generated quantity of carriers are changed based on the change in the electron condition in constituent molecules of the element by light irradiation, as found in photochromism. The time constant involving the returning of the electron condition in molecules in relaxation process is considerably long ranging from several hours to several days.

As mentioned above, plastic functional element of the present invention uses the relaxation process of carriers for reading out and uses the generation process of carriers for input of information in the case that the functional element is used as memory element. For reading out, light irradiation or voltage application under a certain condition is used as a reading signal. In the case that the functional element is used as an operational element as described later, the relaxation process of carrier is used for an operation of signals, and the generation process of carriers is used for a control of an operation.

Figure 5:
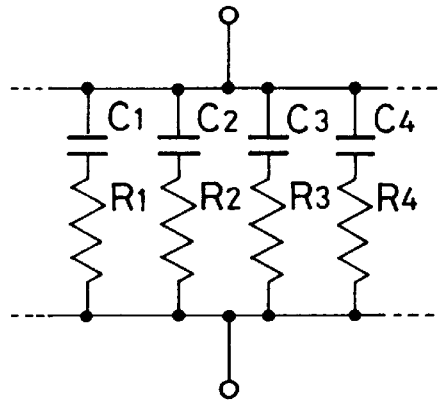
FIG. 5 is an equivalent circuit diagram illustrating the organic memory element shown in FIG. 2.
Figure 6:
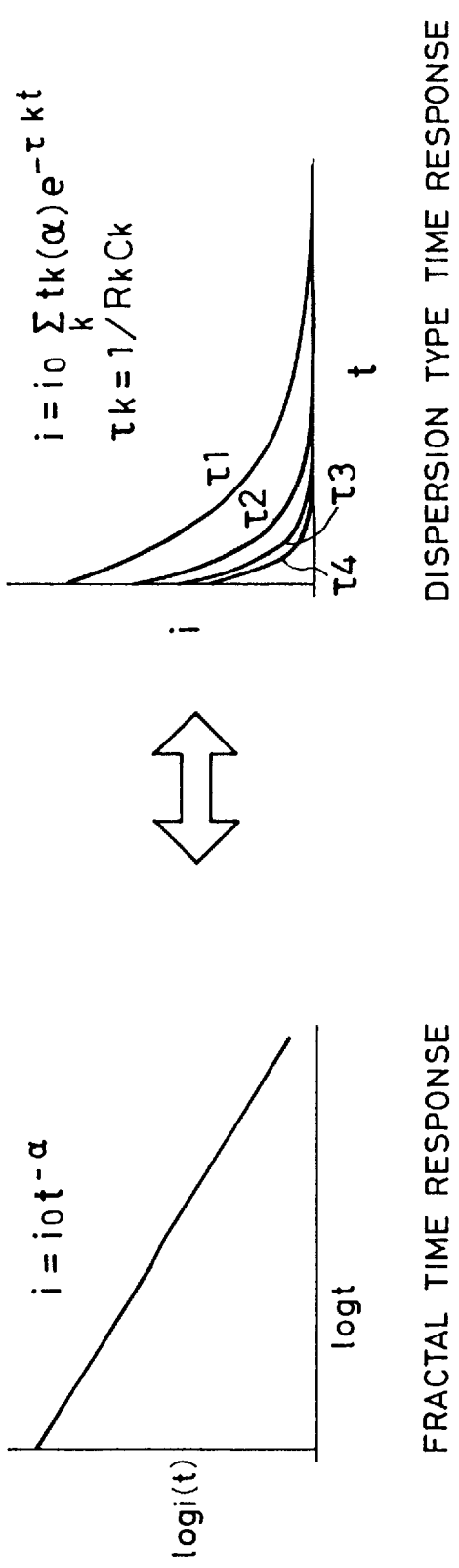
FIG. 6 is a model graph illustrating the relation between current and time in the equivalent circuit shown in FIG. 5.

The above mentioned description is repeated again using equivalent circuit. FIG. 5 is an equivalent circuit of plastic functional element shown in FIG. 2. The equivalent circuit comprises countless many RC circuits having different time constants connected in parallel. An RC circuit having single time constant exhibits the time response in the form of exponential function, but in the case of plastic functional element, as shown in FIG. 6, as a result of weighted summation of exponential functions with individual time constants, the circuit exhibits the time response in the form of a power function (Fractal time response). This weight is the value relating to the above mentioned initial current value i(0) and power exponent a. By modulating this value with light irradiation or voltage application, the initial state and power exponent can be modulated. The dependence of the weight on the time (relaxation time) is ranging from several hours to several days as mentioned above, and used as a memory.

Figure 7:
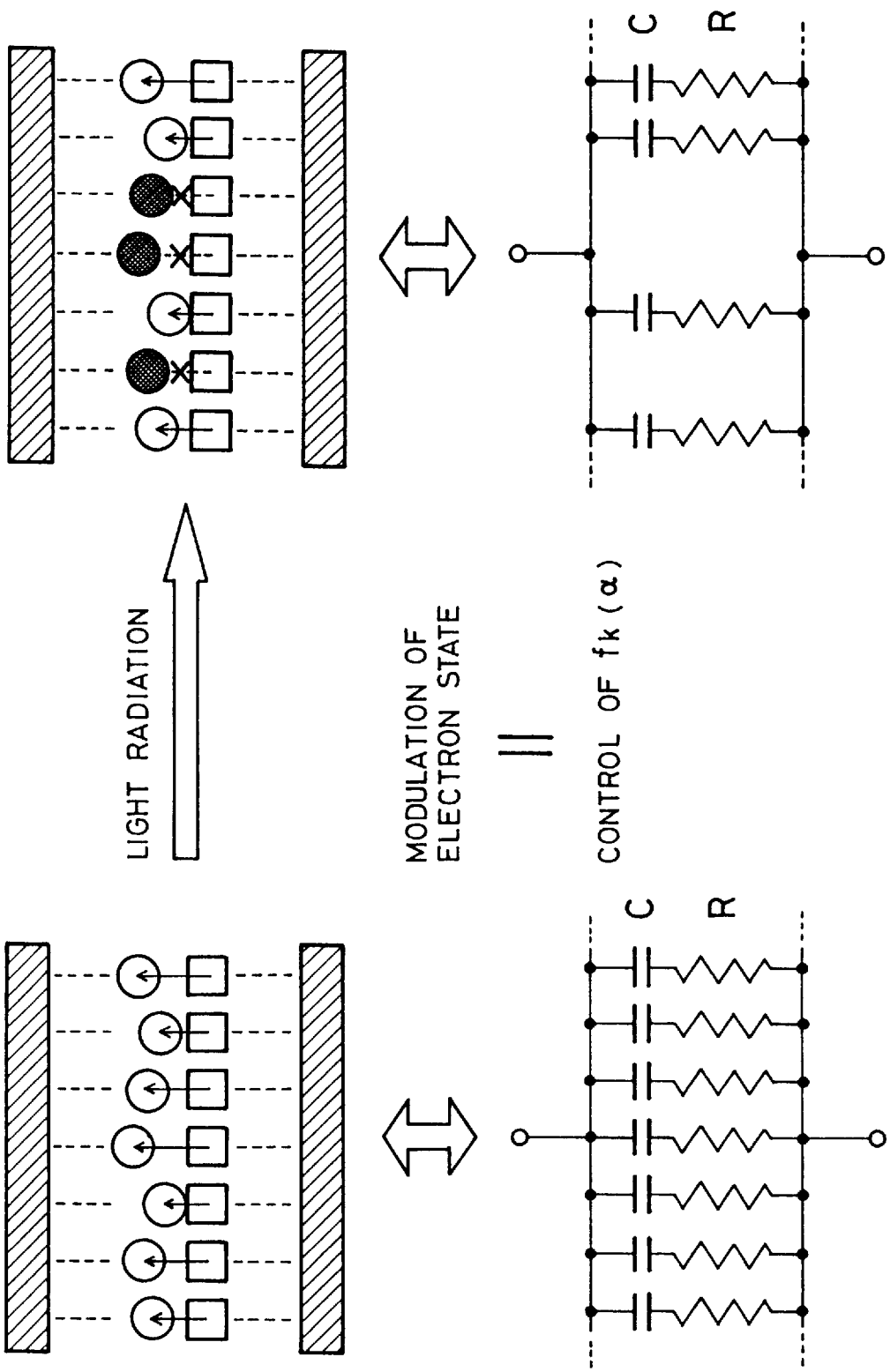
FIG. 7 is a diagram explaining a practical example of the modulation of the electron condition at the contact, according to an embodiment of the present invention.

A practical example of the modulation on the initial state and the power exponent is shown in FIG. 7. In FIG. 7, porphyrin is used as the second molecular membrane in FIG. 2 and flavin is used as the first molecular membrane, and the change in electron condition when light is irradiated to the contact surface of molecular membranes is shown. The intermolecular electron transfer shown by arrows on the top left in the figure is stopped depending on the state of the molecular membrane as shown by symbols "X" on the top right in the figure. In FIG. 7 below, the above-mentioned situation is shown using equivalent circuit, that is, the above mentioned situation corresponds to the situation of the equivalent circuit in which a part of the RC circuits are removed therefrom, and that is the modulated situation.

Figure 8:
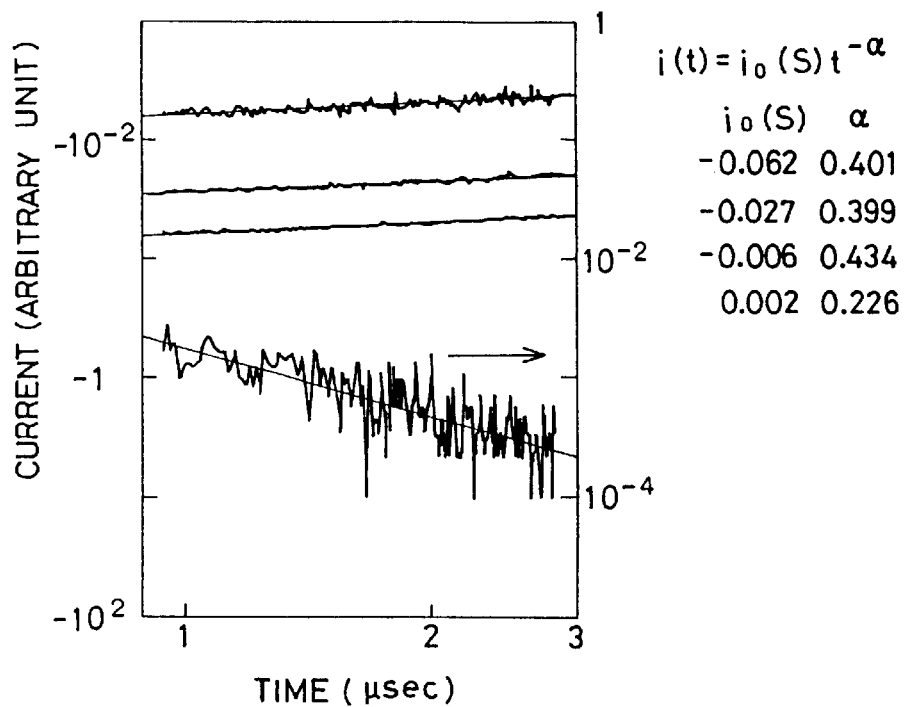
FIG. 8 is a logarithmic graph for illustrating the relation between current and time in the organic memory element shown in FIG. 2.
Figure 9:
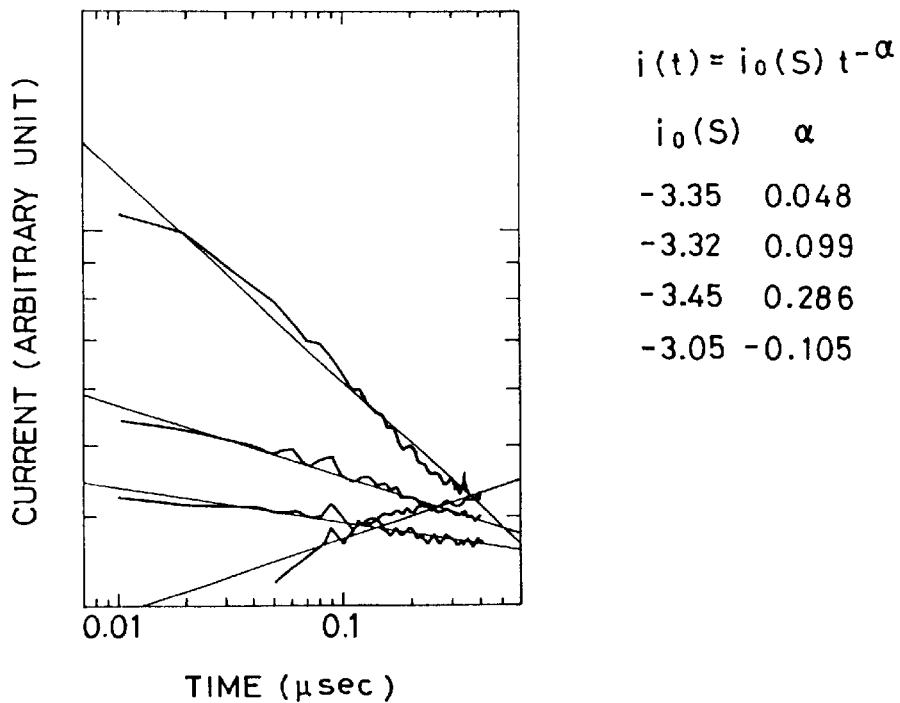
FIG. 9 is another logarithmic graph illustrating the relation between current and time in the organic memory element shown FIG. 2.

FIG. 8 is a graph showing the time response of currents corresponding to different initial current values in the graph in FIG. 6, and FIG. 9 is a graph for describing the time response of currents corresponding to different power exponents.

In conclusion according to the present invention, a function of a combination of a dispersion electric conductivity and a control of the state of electrons by irradiating light or applying a voltage can be realized by a singe element which can be used as a novel functional element.

Embodiment 2

An organic memory element according to an embodiment 2 of the present invention is described in the following. In the above-mentioned embodiment 1, pulse light is used as a means for generating carrier, instead, in this embodiment 2, a voltage is applied perpendicular to the membrane to generate carriers on the hetero contact surface and to generate an output response current of power function. By controlling the electric field of the hetero contact surface with applied voltage, the control of the initial current and the power exponent is possible. Thus the memory element is possible to store a time changing signal of the applied voltage.

Figure 10A:
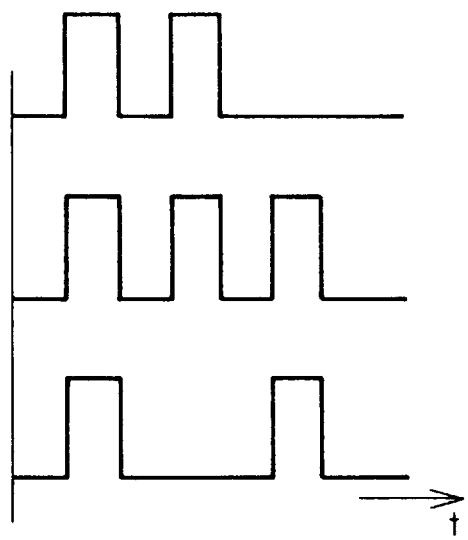
FIG. 10A and FIG. 10B are waveform diagrams illustrating two examples of input rectangular voltage fed to the organic element of the present invention.

For example, in the case of input voltage comprising three rectangular waveforms with different timing as shown in the waveform diagram of FIG. 10A, using reading signals of pulse light or step voltage under the same condition, the element provides current response output having initial current value corresponding one-to-one to each rectangular voltage, then the identification of the rectangular voltage is possible.

Figure 10B:
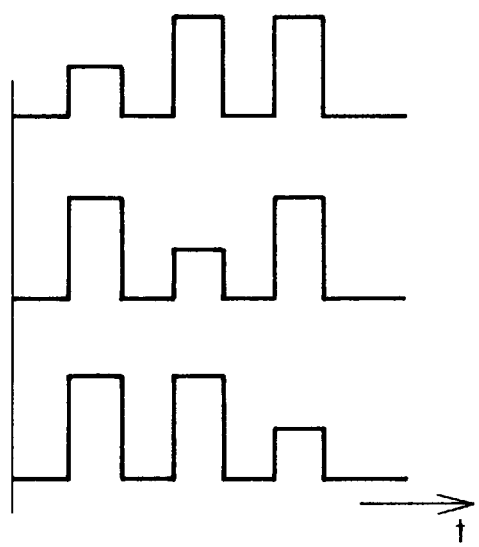

In the case of rectangular voltages input with different intensities as shown in the waveform diagram of FIG. 10B, using reading signals of pulse light or step voltages under the same condition, the element provides current response output having initial current value corresponding one-to-one to each rectangular voltage, then the identification of rectangular waveform is possible. By applying a voltage reversely to the direction of the internal electric field in the hetero contact surface to erase the carrier stored in the hetero contact surface, erasing of memory is possible. By utilizing this characteristic, a rewritable memory can by realized.

Embodiment 3

Figure 11A:
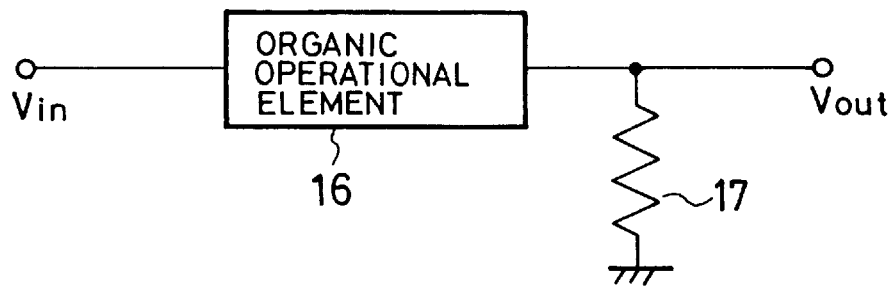
FIG. 11A and FIG. 11B are circuit diagrams illustrating organic operational elements according to two embodiments of the present invention.

FIG. 11A is a circuit diagram showing an organic operational element in accordance with another embodiment of the present invention, where the element is for differential operation. The organic operational element 16 has the same constitution as described in the embodiment 1, and the numeral 17 represents a resistor. Hereunder, as means to represent transient response of this circuit, Laplace transformation representation is used. The transient current response to step bias from the organic operational element 16 is written as, $$i(s)=i(0)\Gamma(1-a)s^a$$

where $\Gamma(1-a)$ represents a Gamma Function. When the resistance R of the resistor 17 in the circuit of this example is sufficiently small, the output voltage $V_{out}(s)$ responding to the input voltage $V_{in}(s)$ is written as, $$V_{out}(s) = i(0)\Gamma(1-a)Rs^a/\{i(0)\Gamma(1-a)Rs^a + 1\}V_{in}(s) \sim i(0)\Gamma(1-a)Rs^aV_{in}(s)$$

By inverse Laplace transformation, the output voltage $V_{out}(t)$ responding to the input voltage $V_{in}(t)$ is written as, $$V_{out}(t) = i(0)\Gamma(1-a)R/\Gamma(-a)\int_0^\infty V_{in}(t-\tau)\tau^{-a-1}d\tau$$

Thus, it will be seen that the output voltage is represented in a form of differential operation with non-integral a-rank with respect to time of input voltage.

Figure 11B:
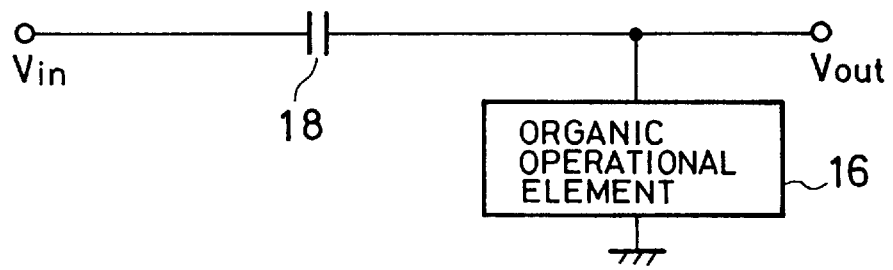

Similarly, FIG. 11B is a circuit diagram showing another example for differential operation. In this circuit, the organic operational element 16 has the same constitution as shown in the embodiment 1, and the numeral 18 represents a capacitor. When the capacity C of the capacitor 18 is sufficiently small, the output voltage time response $V'_{out}(t)$ responding to input voltage $V'_{in}(t)$ is written as, $$V'_{out}(t) = i(0)C/\Gamma(1-a)/\Gamma(1+a)\int_0^\infty V_{in}(t-\tau)\tau^{a-2}d\tau$$

Thus, it will be seen that the output voltage is represented in a form of differential operation with non-integral (1−a) rank with respect to time of the input voltage. Based on this characteristic of the circuit, by controlling the exponent a with the intensity, wave length, and timing of incident light pulse, the differential operation with non-integral various rank with respect to time of time changing voltage signal is possible.

Embodiment 4

Figure 12A:
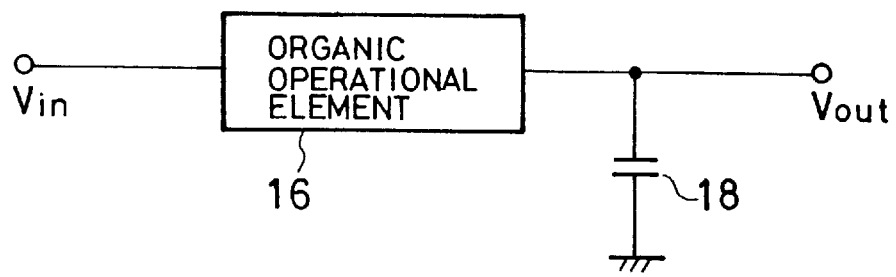
FIG. 12A and FIG. 12B are circuit diagrams illustrating organic operational elements according to the other two embodiments of the present invention.

FIG. 12A is a circuit diagram showing an organic operational element in accordance an embodiment 4 of the present invention, where the element is for integration operation. The organic operational element 16 has the same constitution as shown in the embodiment 1, and the numeral 18 represents a capacitor. Hereunder, as a means to represent transient response of this circuit the Laplace transformation representation is used as in the above mentioned example. The transient current response to step bias from the organic operational element having the same constitution as shown in Example 1 is written as, $$i(s)=i(0)\Gamma(1-a)s^a$$

When the capacity C of the capacitor 18 in the circuit of this example is sufficiently large, the output voltage $V_{out}(s)$ responding to input voltage $V_{in}(s)$ is written as, $$V_{out}(s) =$$
$$i(0)\Gamma(1-a)s^{a-1}/(i(0)\Gamma(1-a)s^{a-1} + C)V_{in}(s) \sim i(0)\Gamma(1-a)/Cs^{a-1}V_{in}(s)$$

By inverse Laplace transformation, the output voltage time response $V_{out}(t)$ responding to input voltage $V_{in}(t)$ is written as, $$V_{out}(t) = i(0)/C \int_0^\infty V_{in}(t-\tau)\tau^{-a}d\tau$$

Thus, it will be seen that the output voltage is represented in a form of integration operation with non-integral (1−a) rank with respect to time of the input voltage.

Figure 12B:
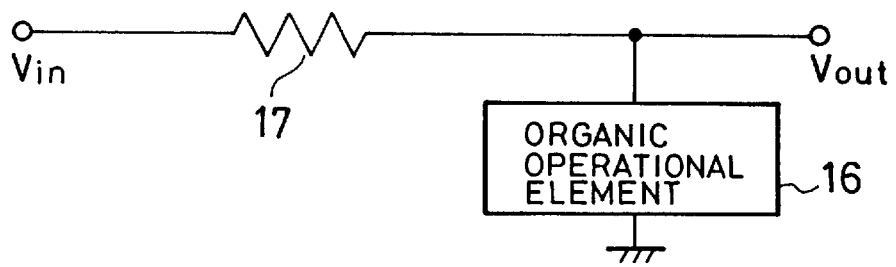

Similarly, the circuit diagram FIG. 12B represents another example for differential operation, in this circuit the organic operational element 16 has the same constitution as shown in the embodiment 1, and the numeral 17 represents a resistor. When the resistance R is large enough, the output voltage time response $V'_{out}(t)$ responding to input voltage $V'_{in}(t)$ is written as, $$V'_{out}(t) = i(0)R/\Gamma(1-a)/\Gamma(a) \int_0^\infty V'_{in}(t-\tau)\tau^{a-1}d\tau$$

Thus, it will be seen that the output voltage is represented in a form of integration operation with non-integral a-rank with respect to time of the input voltage. Based on this characteristic of the circuit, by controlling the exponent a with the intensity, wave length, and timing of incident light pulse, the integration operation with non-integral various rank with respect to time of time changing voltage signal is possible using this circuit.

Embodiment 5

Figure 13:
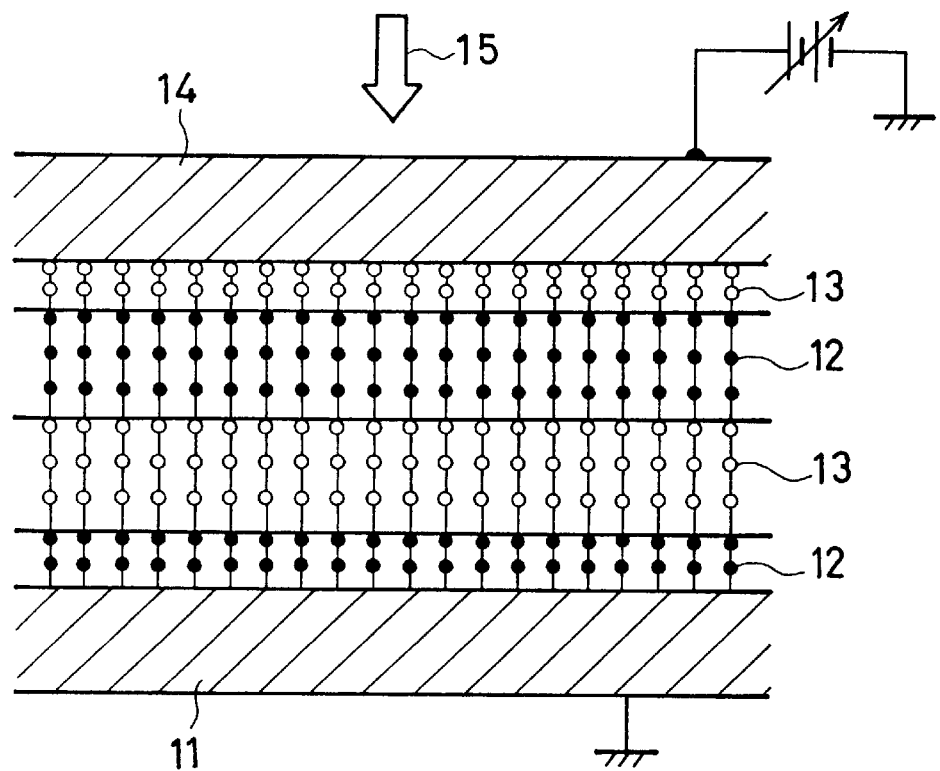
FIG. 13 is a cross sectional schematic diagram illustrating the structure of an organic memory element according to another embodiment of the present invention.

FIG. 13 is a schematic cross sectional diagram showing the structure of a plastic functional element or organic memory element according to another embodiment of the present invention. In the case of the element structure described in the embodiment 1, as the oxidation reduction material membrane, a two-layered membrane comprising a layer of laminated nine monomolecular membranes of RuHP(ph)$_2$ (the first molecular membrane 12) and a layer of laminated ten DNI molecular membranes (the second molecular membrane 13) are employed. By contrast, in this example, LB method is applied to control the thickness of membrane in the monomolecular unit, that is, RuHP(ph)$_2$ molecular membranes and DNI molecular membranes are laminated alternately to form a multi-layered membrane which includes increased number of hetero contact surfaces and exhibits improved carrier generation efficiency per unit area. The relaxation time of the carriers is controllable by changing the thickness of the molecular membrane, thereby the sensitivity to the time changing signal of light or applied voltage and memory capacity is enhanced.

Embodiment 6

Figure 14:
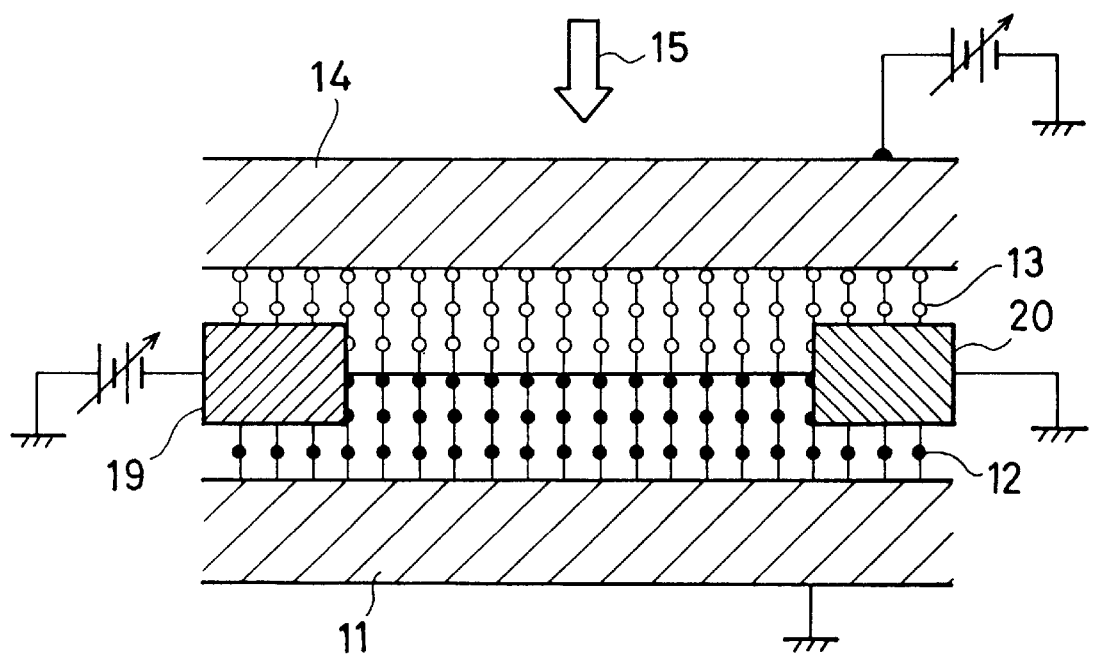
FIG. 14 is a cross sectional schematic diagram illustrating the structure of an organic operational element according to still another embodiment of the present invention.

FIG. 14 is a schematic cross sectional diagram showing the structure of an organic operation element in accordance with another embodiment of the present invention. In the figure, the lower electrode 11 is consisted of conducting material typically like as metal; the first molecular membrane 12 with an oxidation reduction potential is formed on the lower electrode 11; a source electrode 19 is comprised of conducting material typically like as metal formed on and partially anchored into the first molecular membrane 12; a drain electrode 20 is formed of conducting material typically like as metal is formed on and partially anchored into the first molecular membrane 12, the second molecular membrane 13 with an oxidation reduction potential different from that of the first molecular membrane 12 is formed on the first molecular membrane 12, source electrode 19, and drain electrode 20; the transparent upper electrode 14 is typically comprised of, for example, semitransparent aluminum membrane with a thickness of 10 nm or transparent ITO (Indium-tin oxide) membrane and is formed on the second molecular membrane 13; and light 15 is irradiated to the first molecular membrane 12 and the second molecular membrane 13 through the transparent upper electrode from a light source provided outside (not shown in the figure).

The method for preparation of an element in FIG. 14 is described hereunder.

By vacuum evaporation method, for example, an aluminum evaporated membrane with a thickness of 100 nm is formed as the lower electrode 11 on a substrate, and thereon for example, by Langmuir-Blodgett method (hereinafter referred to as LB method), nine layers of hematoporphyrin (IX)-bis(tridecanoylether)Ru(P(OCH$_3$)$_3$)$_2$Br (hereinafter referred to as RuHP(ph)$_2$) are formed, or by vacuum evaporation method, a RuHP(ph)$_2$ multi-layer membrane with a thickness of 20 nm is formed, or by organic ICB method, a RuHP(ph)$_2$ multi-layer membrane with a thickness of 20 nm is formed as the first molecular membrane 12.

Then, the first molecular membrane 12 is partially etched off with a depth of 10 nm to form the source electrode 19 and the drain electrode 20 of evaporated aluminum membrane. On the first molecular membrane 12, source electrode 19, and drain electrode 20, for example, ten layers of 7,8-dimethyl-3,10-dinonyl isoalloxazin (hereinafter referred to as DNI) is laminated by LB method, or by vacuum evaporation method, DNI with a thickness of 20 nm is laminated, or by organic ICB method, DNI with a thickness of 20 nm is laminated, as the second molecular membrane 13 with an oxidation reduction potential different from that of the first molecular membrane 12. Then, on the second molecular membrane 13, an aluminum membrane with a thickness of 10 nm is formed as the upper electrode 14 by evaporation method.

The operational mechanism of the element in FIG. 14 is described hereunder.

By applying a voltage between the source electrode 19 and drain electrode 20, it is possible to control the electric field parallel to the hetero surface so as to control the carrier generation and relaxation. Using incident light or using two parameters of electric fields, i.e., one is perpendicular to and another is parallel to the hetero surface, the initial current transient response of power function and power exponent can be controlled.

Embodiment 7

Figure 15A:
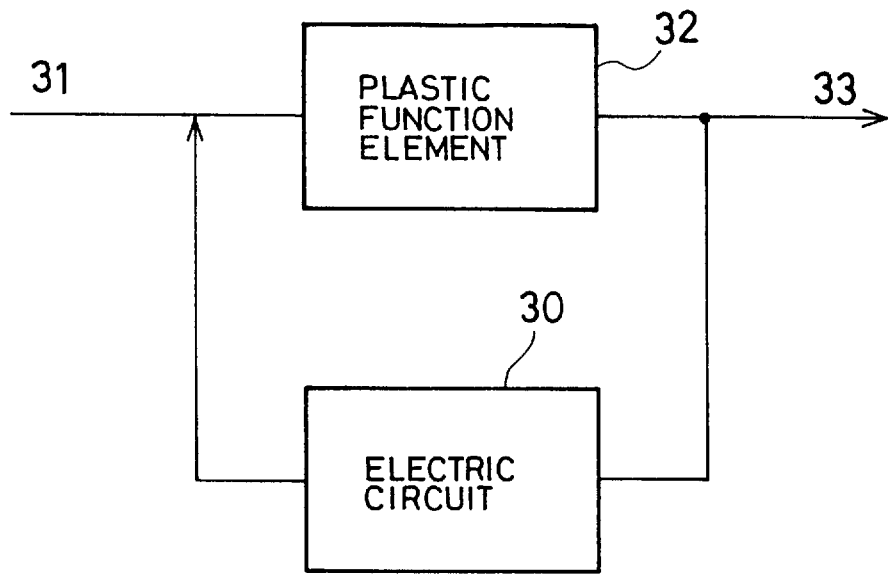
FIG. 15A is a block diagram illustrating a chaos signal generating element according to an embodiment of the present invention.

FIG. 15A is a block diagram showing a circuit of a chaos signal generating element which is a plastic functional element in accordance with the present invention and which is used as a part of an electric circuit. In the figure, a plastic functional element 32 is prepared in the same way as used in Example 1 through Example 5 and has the same element structure as used in the same examples. An input 31 represents periodic voltage input or periodic light incident to the plastic functional element 32, and in some cases, there is no input 31. An electric circuit 30 is comprised of resistor elements (R), capacitor elements (C), inductance elements (L) or non-linear elements such as diodes or active element such as transistors or operational amplifiers, and because of feedback through the plastic functional element, the electric circuit 30 functions as an oscillator. An output 33 provides voltage output signals.

Figure 15B:
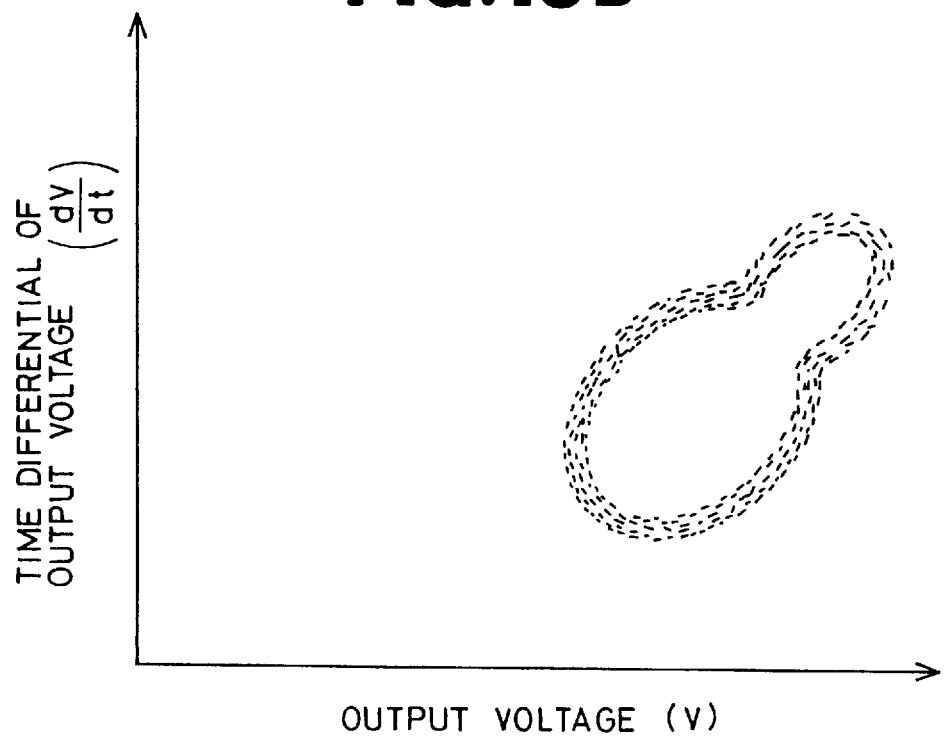
FIG. 15B is a graph illustrating the relation between the output voltage from the above mentioned chaos signal generating element and its time differential.

The operational mechanism of the chaos signal generating element in FIG. 15A is described herein. The plastic functional element exhibits, with respect to electric charges generated by photo-excitation, the electric conductivity characteristic which varies with power exponent of time reflecting Fractal feature of the membrane structure. With respect to electric charges injected from the electrode in stead of photo-excitation, the element exhibits the same electric conductivity characteristic. Incorporating a plastic functional element with this type of conductivity characteristic in a feedback of an electric circuit, the frequency of oscillation mode generated from the electric circuit is changeable within three modes depending on the values of LCR of the circuit, that is constant frequency, periodically changing frequency, or caotically changing frequency. In the case of caotically changing frequency oscillation, chaos signals are output and the circuit can be operated as a chaos signal generating element. In FIG. 15B, the output voltage is assigned to abscissa and time differential value of the output voltage is assigned to ordinate, and the values are recorded at a certain time interval intermittently. It will be seen that the output is chaos.

Embodiment 8

Figure 16:
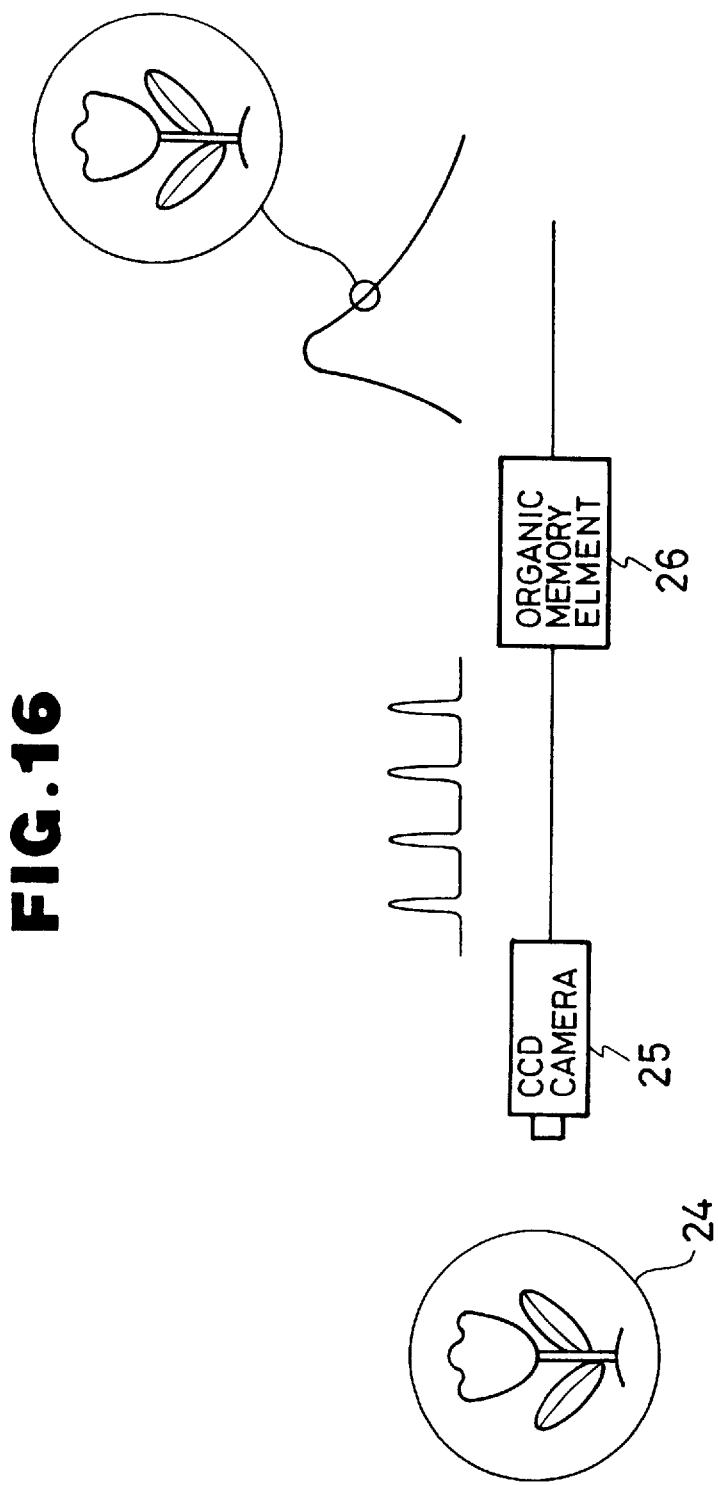
FIG. 16 is a diagram explaining an image memory system according to still another embodiment of the present invention.

FIG. 16 is an illustration of an image memory system according to an embodiment of the present invention in which an organic memory element of this invention is employed as an image memory element. In the figure, an input image 24 is a two dimensional image, and a CCD camera 25 converts the information of the two dimensional light intensity into time series signal. An organic memory element 26 is prepared in the same manner and has the same constitution as described in the embodiments 1 through 5.

The operational mechanism of the image memory system in FIG. 16 is described herein. The CCD camera 25 converts the two dimensional light information from the input image 24 into one dimensional time series electric signal. The time series electric signals are input to the organic memory element to store the time series electric signals, and then using light pulses or step voltages as a read out signal, the output current corresponding to the time series electric signals is read out. Thereby the input image 24 can be stored and read out. The memory of the input image 24 is erasable by applying a bias voltage. Thus, the system is used as a re-writable two dimensional image memory.

Embodiment 9

Figure 17:
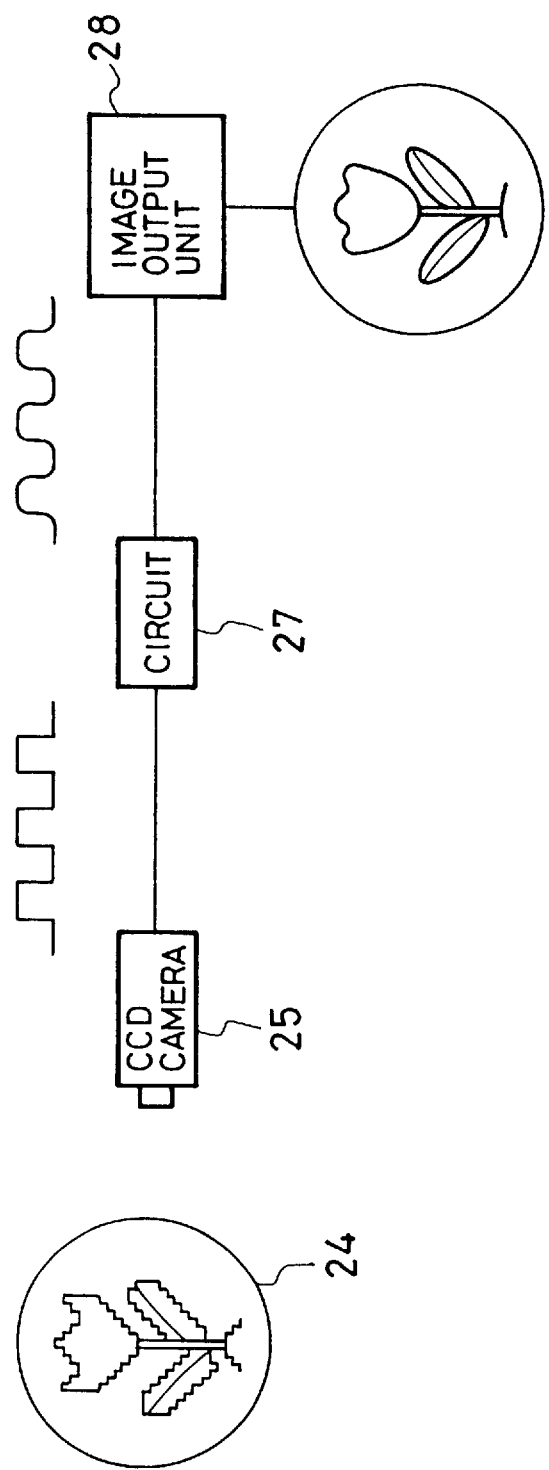
FIG. 17 is a diagram explaining an image processing system according to still another embodiment of the present invention.

FIG. 17 is an structural illustration of an image processing system according to another embodiment of the present invention. In the figure, the input image 24 is a two dimensional image, and the CCD camera 25 converts the information of the two dimensional light intensity into time series signal. A circuit 27 is operated in the same way as described in the embodiment 3, and the numeral 28 represents an image output unit.

The operational mechanism of the image processing system in FIG. 17 is described herein. The two dimensional light information from the input image 24 is converted into one-dimensional time series electric signal through the CCD camera 25. By non-integral differential of the time series electric signal, the simple image is converted into a real image, and the real image is derived as an output from the image output unit 28.

Embodiment 10

Figure 18A:
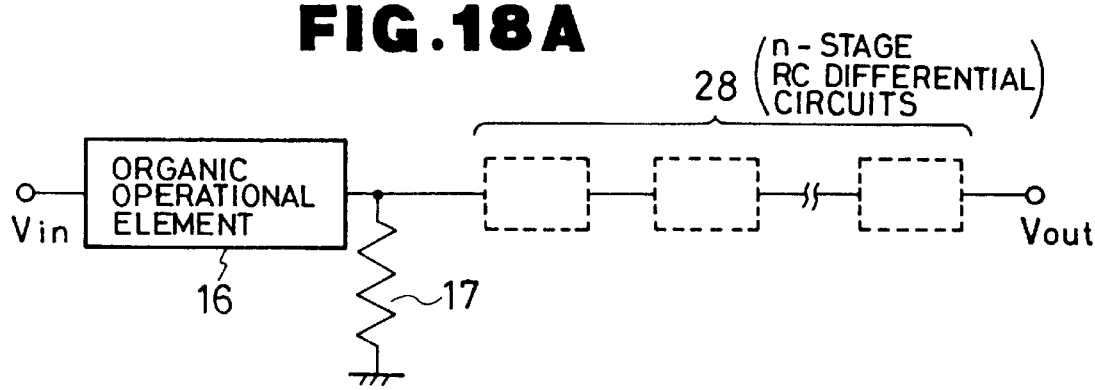
FIG. 18A and FIG. 18B are circuit diagrams illustrating organic operational elements according to still another embodiment of the present invention.

FIG. 18A is a circuit diagram of an organic operational element where the element operates a non-integral rank differential operation, according to still another embodiment of the present invention. In the figure, the numeral 16 represents an organic operational element with the same constitution as that described in the embodiment 1, and the numeral 28 is an RC differential circuit including n sets of couples each consisting of a resistor R and a capacitor C, and the numeral 17 represents a resistor. Hereunder, the Laplace transformation representation is used for expression of transient response of this circuit. The current transient response to the step bias from the element described in the embodiment 1 is written as, $$i(s) = i(0)\Gamma(1-a)s^a$$

When the resistance R in the circuit of this embodiment is sufficiently small, the output voltage $V_{out}(s)$ responding to the input voltage $V_{in}(s)$ is written as, $$V_{out}(s) = i(0)\Gamma(1-a)Rs^a/(i(0)\Gamma(1-a)Rs^a + 1)s^{-n}V_{in}(s) \sim i(0)\Gamma(1-a)Rs^a V_{in}(s)$$

By inverse Laplace transformation, the output voltage time response $V_{out}(t)$ responding to the input voltage $V_{in}(t)$ is written as, $$V_{out}(t) = i(0)\Gamma(1-a)R/\Gamma(-a)\int_0^\infty V_{in}(t-\tau)\tau^{-a-n-1}d\tau$$

It will be seen that the output voltage is the result of a differential operation with non-integral (a+n) rank with respect to time of the input voltage.

Figure 18B:
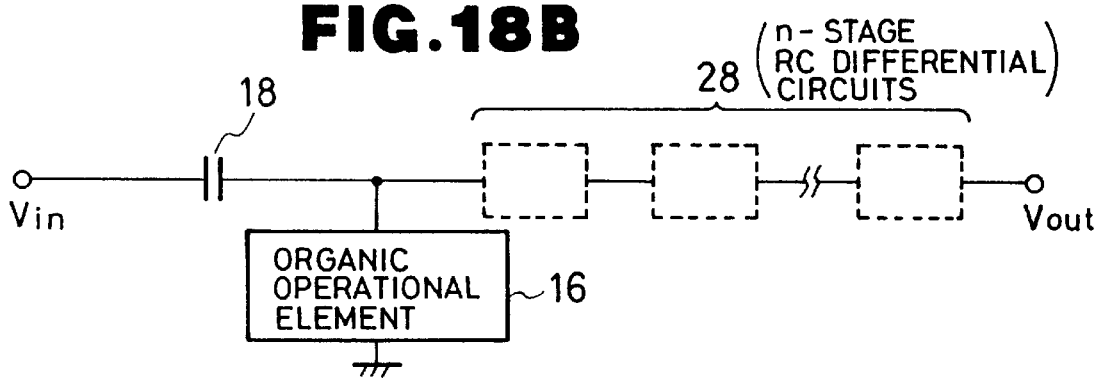

Similarly, FIG. 18B is a circuit diagram for a differential operation with infinite real number rank. In the figure, the numeral 16 represents an organic operational element having the same constitution as that described in the embodiment 1; the numeral 28 represents an RC differential circuit comprising n sets of couples each consisting of a resistor R and a capacitor C; and the numeral 18 represents a capacitor. When the capacity C is sufficiently small, the output voltage time response $V'_{out}(t)$ responding to the input voltage $V'_{in}(t)$ is written as, $$V'_{out}(t) = i(0)C/\Gamma(1-a)/\Gamma(1+a)\int_0^\infty V_{in}(t-\tau)\tau^{a-2-n}d\tau$$

It will be seen that the output voltage is the result of a differential operation with non-integral (1−a+n) rank with respect to time of input voltage. Based on such a circuit characteristic, the exponent a is controlled by changing the intensity, the wave length, and the timing of incident light pulses, and then the circuit can be used for differential operation with infinite real number rank with respect to time of time changing voltage signal.

Embodiment 11

Figure 19A:
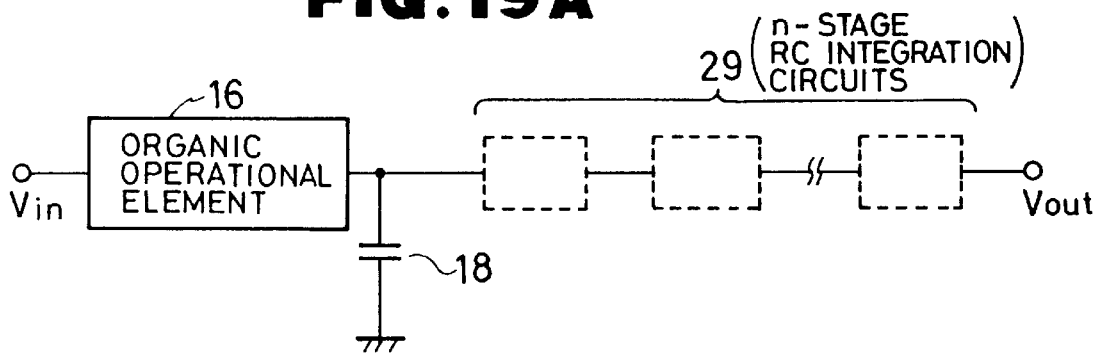
FIG. 19A and FIG. 19B are circuit diagrams illustrating organic operational elements according to still another embodiment of the present invention.

FIG. 19A is a circuit diagram of an organic operational element, where the element operates an integration operation with infinite real number rank, according to still another embodiment of the present invention. In the figure, the numeral 16 represents an organic operational element with the same constitution as that described in the embodiment 1, the numeral 18 represents a capacitor, and the numeral 29 represents an RC integration circuit including n sets of couples each consisting of a resistor R and a capacitor C. Hereunder, the Laplace transformation representation is used as a means for expressing transient response of this circuit in the same manner as used in embodiments 3 and 5. The transient current response to step bias in the element described in the embodiment 1 is written as, $$i(s)=i(0)\Gamma(1-a)s^a$$

When the capacity C of the capacitor 18 in the circuit of this example is sufficiently large, the output voltage $V_{out}(s)$ responding to the input voltage $V_{in}(s)$ is written as, $$V_{out}(s) = i(0)\Gamma(1-a)s^{a-1}/(i(0)\Gamma(1-a)s^{a-1} + C)s^n V_{in}(s) \sim$$
$$i(0)\Gamma(1-a)/Cs^{a+n-1}V_{in}(s)$$

By inverse Laplace transformation, the output voltage time response Vout(t) responding to the input voltage Vin(t) is written as, $$V_{out}(t) = i(0)/C \int_0^\infty V_{in}(t-\tau)\tau^{-a+n}d\tau$$

It will be seen that the output voltage is integration operation with non-integral (1−a+n) rank involving time of input voltage.

Figure 19B:
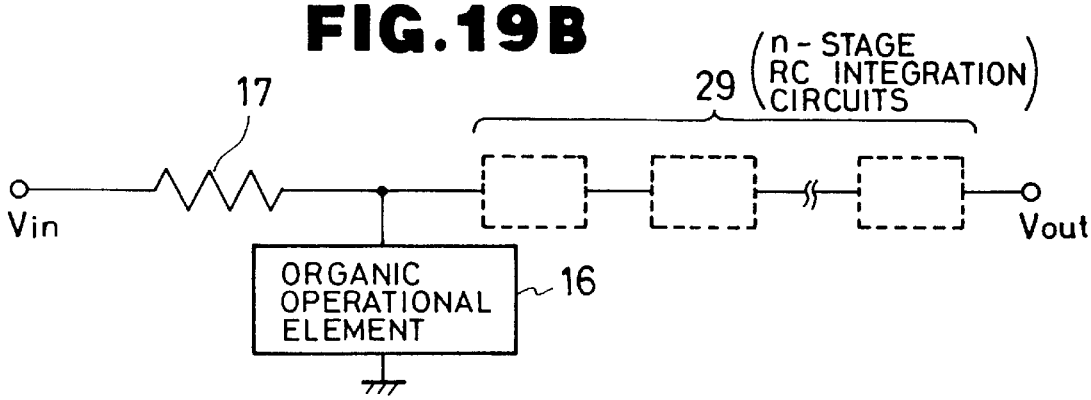

Similarly, FIG. 19B is a circuit diagram for an integral operation with infinite real number rank. In the figure, the numeral 16 is an organic operational element having the same constitution as that described in the embodiment 1, the numeral 29 represents an RC integration circuit including n sets of couples each consisting of a resistor R and a capacitor C, and the numeral 17 is a resistor. When the resistance R is sufficiently large, the output voltage time response $V'_{out}(t)$ responding to the input voltage $V'_{in}(t)$ is written as, $$V'_{out}(t) = i(0)/R/\Gamma(1-a)/\Gamma(a) \int_0^\infty V'_{in}(t-\tau)\tau^{a-1+n}d\tau$$

It will be seen that the output is the result of an integration operation with non-integral (a+n) rank with respect to time of input voltage. Based on such a circuit characteristic, the exponent a is controlled by changing the intensity, the wave length, and the timing of the incident light pulses, thereby the circuit can be used for integration operation with infinite real number rank with respect to time of the time changing voltage.

In the above-described embodiments, RuHP(ph)2 is used as the first oxidation reduction material, however, it may also be possible to use other substances, for example, 7,12-bis(1-(oxitridecyl)ethyl)-8,13,17-tetramethyl-2,18-bis (2-methoxycarbonylethyl)21H,23H-porphin, 7,12-bis(1-(oxitridecyl)ethyl)-8,13,17-tetramethyl-2,18-bis(2-methoxycarbonylethyl)-porphinateruthenium carbonyl, 7,12-bis(1-(oxytridecyl)ethyl)-8,13,17-tetramethyl-2,18-bis(2-methoxycarbonylethyl)porphinateruthenium(II) pyrizinecarbonyl, 7,12-bis(1-(oxytridecyl)ethyl)-8,13,17-tetramethyl-2,18-bis(2-methoxycarbonylethyl) porphinateruthenium(II)bisphosphoroustrimethyl, 7,12-bis (1-(oxytridecyl)ethyl)-8,13,17-tetramethyl-2,18-bis(2-carboxyethyl)porphinateiron(III)monochloride, 7,12-bis(5-(4'-n-pentylphenyl)-(1-n-pentyloxy))ethyl-3,8,13,17-tetramethyll-2,18-bis(2-carboxyethyl)-porphinate-bromo-bis(trimethoxyphosphin)-ruthenium(III), and these substances exhibit the same performance.

As the second oxidation reduction material DNI is described as an example, however, it may also be possible to use other substances, for example 7,8-dimethyl-3,10-dinonylisoalloxazin-8a-yl)thioacetate, 7,8-dimethyl-3,10-dinonylisoalloxazin-8a-yl)thiosuccinate, 7,8-dimethyl-10-octadecylisoal-loxazin, and these substances exhibit the same performances.

The present invention is constituted as described hereinbefore, and exhibits usefulness as described hereunder.

A plastic functional element in accordance with the first aspect of the present invention comprises, a first oxidation reduction material membrane comprised of a first oxidation reduction material, a second oxidation reduction material membrane comprised of a second oxidation reduction material having a different oxidation reduction potential from that of the first oxidation reduction material provided in contact with the first oxidation reduction material membrane, a first electrode connected to the first oxidation reduction material membrane, and a second electrode connected to the second oxidation reduction material membrane, the first and the second oxidation reduction material membranes being sandwiched between the second electrode and the first electrode and, based on the difference between the first and the second oxidation reduction materials, the electron condition in the first or the second oxidation reduction material is controlled by at least one of light irradiation and voltage application, and the generation and relaxation processes of carriers are controlled. Thereby the electron condition in the first or the second oxidation reduction material membrane is controlled (modulated) and the changed condition is maintained for a certain period of time. To dope the carriers, the intermolecular electron transfer which is controllable by light or voltage is used, and monomolecular membrane are employed, hence minimization of element size is possible and an element with high density and high speed operability is provided.

An organic memory element in accordance with the second aspect of the present invention comprises, a first oxidation reduction material membrane comprised of a first oxidation reduction material, a second oxidation reduction material membrane comprised of a second oxidation reduction material having an oxidation reduction potential different from that of the first oxidation reduction material provided in contact with the first oxidation reduction material membrane, a first electrode connected to the first oxidation reduction material membrane, and a second electrode connected to the second oxidation reduction material membrane, the first and the second oxidation reduction material membranes being sandwiched between the second electrode and the first electrode and, based on the difference between the first and the second oxidation reduction materials, the electron condition in the first or the second oxidation reduction material is controlled by at least one of light irradiation and voltage application, and hence time changing signals of input light or input voltage are stored, light pulse or step voltage is used as read out signal. Thereby the generation and relaxation processes of carriers are controlled, and the electron condition in the first or the second oxidation reduction material membrane is changed, and incident light information or information of applied voltage is stored.

By controlling the wave length or intensity of irradiated light or by controlling the voltage applied between electrodes, the generation relaxation process of the carrier is controlled, that is, the electron condition in the first or the second oxidation reduction membrane is controlled, and also the memory capacity for input information is controlled.

By applying voltage, the carrier stored in the first or the second oxidation reduction material membrane is erased, that is, input information is erased, hence re-writing is possible, and repeated writing and reading of information is possible.

By providing a source electrode and a drain electrode apart in the plane of the contact surface between the first and the second oxidation reduction material membrane, and by applying a voltage between the above mentioned source electrode and drain electrode to control the electron condition in the first or the second oxidation reduction material, a large amount of incident light information and information of applied voltage can be stored, and the memory capacity can be maximized.

An organic memory element in accordance with the third aspect of the present invention comprises, a first oxidation reduction material membrane comprised of a first oxidation reduction material, a second oxidation reduction material membrane comprised of a second oxidation reduction material having an oxidation reduction potential different from that of the first oxidation reduction material provided in contact with the first oxidation reduction material membrane, a first electrode connected to the first oxidation reduction material membrane, and a second electrode connected to the second oxidation reduction material membrane, the first and the second oxidation reduction material membranes being sandwiched between the second electrode and the first electrode and, based on the difference between the first and the second oxidation reduction materials, the electron condition in the first or the second oxidation reduction material is controlled by at least one of light irradiation and voltage application, after the light irradiation or voltage application the input of time changing voltage signal is fed to provide output of the time related operation. Thereby the generation and relaxation processes of carriers are controlled and the electron condition in the first or the second oxidation reduction material membrane is changed to provide the element with the capability of operational function responding to the input voltage.

By controlling the wave length or intensity of irradiated light or by controlling the voltage applied between the electrodes, the generation and relaxation processes of carriers are easily controlled, that is, the electron condition in the first or the second oxidation reduction material membrane is controlled, hence the operational function is controlled.

By controlling the voltage, the carrier stored in the first or the second oxidation reduction material membrane is erased, that is, input information is erased, hence various re-writing of operation is possible.

A source electrode and drain electrode are provided apart in the plane of the contact surface between the first and the second oxidation reduction material membranes, and by applying a voltage between the above mentioned source electrode and drain electrode, the electron condition in the first or the second oxidation reduction material is controlled, and the operation function is enhanced. For example, differential operation and integration operation with non-integral rank, and various operations such as differential and integration operations with infinite real number rank are possible.

In the cases of the above mentioned organic memory element and organic operational element, by laminating a plurality of layers of the first oxidation reduction membrane and the second oxidation reduction material membrane alternately to form a plurality of hetero contact surfaces, the memory capacity is increased for memory element and the operational function is enhanced for operational element.

By employing Langmuir-Blogett method for forming the above mentioned oxidation reduction material membrane, the thickness of oxidation reduction membrane is controlled in monomolecular membrane unit to provide organic memory element and organic operational element with enhanced function.

By employing organic ICB method or vacuum evaporation method to form oxidation reduction material membrane, fine workability of the element is possible, hence resultant organic memory element and organic operational element are provided with high integration.

An infinite real number rank differential and integration circuit in accordance with the fourth aspect of the present invention comprises the above mentioned operational element and an RC circuit, and the electron condition in the first or the second oxidation reduction material is controlled by at least one of light irradiation and voltage application, thereafter time changing voltage signal input is fed, hence said circuit provides output of the differential or integration operation with infinite real number rank involving time.

A chaos signal generating element in accordance with the fifth aspect of the present invention incorporates the above mentioned organic memory element or organic operational element as a part thereof, by irradiation of light or by application of voltage the generation and suppression of chaos signal are controlled.

An information processing system in accordance with the sixth aspect of the present invention uses chaos signal generated from the above mentioned chaos element, hence said system is provided with information sorting function, memory function, or switching function.

An image memory element in accordance with the seventh aspect of the present invention uses input of one dimensional time changing light pulse or voltage pulse converted from image information, where the input is different from the case of the above mentioned organic memory element, hence image memory, image identification, and image information processing is possible.

What is claimed is:

1. A plastic functional element comprising:

a first oxidation reduction material membrane comprised of a first oxidation reduction material;

a second oxidation reduction material membrane comprised of a second oxidation reduction material having an oxidation reduction potential different from that of said first oxidation reduction material, and provided in contact with said first oxidation reduction material membrane;

a first electrode connected to said first oxidation reduction material membrane; and a second electrode connected to said second oxidation reduction material membrane, said first and second oxidation reduction material membranes being sandwiched between said second electrode and said first electrode;

wherein at least one of said first and second oxidation reduction material membranes includes an alterable inter-molecular transferable electron condition stored within said at least one of said first and second membrane for a certain time periods, said time period being sufficient to maintain storage of a status condition, in response to, and after removal of, a light or voltage stimulus, said electron condition being based on the difference of the oxidation reduction potentials between said first and second oxidation reduction materials.

2. A plastic functional element as claimed in claim 1, wherein said plastic functional element includes an organic memory element which includes a means for storing a time changing signal of input light or input voltage by controlling the electron condition in the first or the second oxidation reduction material, and includes a means for using at least one of a light pulse and a step voltage as a read out signal.

3. A plastic functional element as claimed in claim 2, wherein said organic memory element includes a means for altering the electron condition in said first or second oxidation reduction material to control a memory capacity of input information by being controlled by at least one of a wave length, an intensity of said light stimulus and an applied voltage value.

4. A plastic functional element as claimed in claim 2, wherein said organic memory element includes a means for erasing input information by said voltage application, so as to perform repeated writing in and reading out of input information.

5. A plastic functional element as claimed in claim 3, wherein said organic memory element includes a means for erasing input information by said voltage application, so as to perform repeated writing in and reading out of input information.

6. A plastic functional element as claimed in claim 2, wherein said organic memory element is constructed and arranged such that a source electrode and a drain electrode are provided apart from each other, and in contact with, a plane of a contact surface between said first and second oxidation reduction materials, and includes a means for applying a voltage between said source electrode and said drain electrode so as to control the electron condition in at least one of said first and the second oxidation reduction material.

7. A plastic functional element as claimed in claim 3, wherein said organic memory element is constructed and arranged such that a source electrode and a drain electrode are provided apart from each other, and in contact with, a plane of a contact surface between said first and second oxidation reduction materials, and includes a means for applying a voltage between said source electrode and said drain electrode so as to control the electron condition in at least one of said first and the second oxidation reduction material.

8. A plastic functional element as claimed in claim 4, wherein said organic memory element is constructed and arranged such that a source electrode and a drain electrode are provided apart from each other, and in contact with, a plane of a contact surface between said first and second oxidation reduction materials, and includes a means for applying a voltage between said source electrode and said drain electrode so as to control the electron condition in at least one of said first and the second oxidation reduction material.

9. A plastic functional element as claimed in claim 2, wherein in said organic memory element, a plurality of said first oxidation reduction material membranes and second oxidation reduction material membranes are laminated alternately.

10. A plastic functional element as claimed in claim 3, wherein in said organic memory element, a plurality of said first oxidation reduction material membranes and second oxidation reduction material membranes are laminated alternately.

11. A plastic functional element as claimed in claim 4, wherein in said organic memory element, a plurality of said first oxidation reduction material membranes and second oxidation reduction material membranes are laminated alternately.

12. A plastic functional element as claimed in claim 5, wherein in said organic memory element, a plurality of said first oxidation reduction material membranes and second oxidation reduction material membranes are laminated alternately.

13. A plastic functional element as claimed in claim 6, wherein in said organic memory element, a plurality of said first oxidation reduction material membranes and second oxidation reduction material membranes are laminated alternately.

14. A plastic functional element as claimed in claim 7, wherein in said organic memory element, a plurality of said first oxidation reduction material membranes and second oxidation reduction material membranes are laminated alternately.

15. A plastic functional element as claimed in claim 8, wherein in said organic memory element, a plurality of said first oxidation reduction material membranes and second oxidation reduction material membranes are laminated alternately.

16. A plastic functional element as claimed in claim 2, wherein in said organic memory element, at least one of said first and second oxidation reduction material membrane is monomolecular membrane or a monomolecular laminated membrane prepared by Langmuir-Blodgett method.

17. A plastic functional element as claimed in claim 3, wherein in said organic memory element, at least one of said first and second oxidation reduction material membrane is monomolecular membrane or a monomolecular laminated membrane prepared by Langmuir-Blodgett method.

18. A plastic functional element as claimed in claim 4, wherein in said organic memory element, at least one of said first and second oxidation reduction material membrane is monomolecular membrane or a monomolecular laminated membrane prepared by Langmuir-Blodgett method.

19. A plastic functional element as claimed in claim 5, wherein in said organic memory element, at least one of said first and second oxidation reduction material membrane is monomolecular membrane or a monomolecular laminated membrane prepared by Langmuir-Blodgett method.

20. A plastic functional element as claimed in claim 6, wherein in said organic memory element, at least one of said first and second oxidation reduction material membrane is monomolecular membrane or a monomolecular laminated membrane prepared by Langmuir-Blodgett method.

21. A plastic functional element as claimed in claim 7, wherein in said organic memory element, at least one of said first and second oxidation reduction material membrane is monomolecular membrane or a monomolecular laminated membrane prepared by Langmuir-Blodgett method.

22. A plastic functional element as claimed in claim 8, wherein in said organic memory element, at least one of said first and second oxidation reduction material membrane is monomolecular membrane or a monomolecular laminated membrane prepared by Langmuir-Blodgett method.

23. A plastic functional element as claimed in claim 2, wherein in said organic memory element, at least one of said first and second oxidation reduction material membrane is monomolecular membrane or monomolecular laminated membrane prepared by vacuum evaporation method or organic ICB method.

24. A plastic functional element as claimed in claim 3, wherein in said organic memory element, at least one of said first and second oxidation reduction material membrane is monomolecular membrane or monomolecular laminated membrane prepared by vacuum evaporation method or organic ICB method.

25. A plastic functional element as claimed in claim 4, wherein in said organic memory element, at least one of said first and second oxidation reduction material membrane is monomolecular membrane or monomolecular laminated membrane prepared by vacuum evaporation method or organic ICB method.

26. A plastic functional element as claimed in claim 5, wherein in said organic memory element, at least one of said first and second oxidation reduction material membrane is monomolecular membrane or monomolecular laminated membrane prepared by vacuum evaporation method or organic ICB method.

27. A plastic functional element as claimed in claim 6, wherein in said organic memory element, at least one of said first and second oxidation reduction material membrane is monomolecular membrane or monomolecular laminated membrane prepared by vacuum evaporation method or organic ICB method.

28. A plastic functional element as claimed in claim 7, wherein in said organic memory element, at least one of said first and second oxidation reduction material membrane is monomolecular membrane or monomolecular laminated membrane prepared by vacuum evaporation method or organic ICB method.

29. A plastic functional element as claimed in claim 8, wherein in said organic memory element, at least one of said first and second oxidation reduction material membrane is monomolecular membrane or monomolecular laminated membrane prepared by vacuum evaporation method or organic ICB method.

30. A plastic functional element as claimed in claim 1, wherein said plastic functional element includes an organic operational element which includes a means for performing an operation with respect to time by inputting a time changing voltage signal after controlling at least one of said first and second oxidation reduction materials so as to hold the electron condition for the certain time period, said time period being sufficient to maintain storage of a status of said changed condition.

31. A plastic functional element as claimed in claim 30, wherein said organic operational element includes a means for controlling the operational function by reacting to at least one of a wave length, an intensity of said light stimulus and a voltage applied to control the electron condition in at least one of the first and second oxidation reduction materials.

32. A plastic functional element as claimed in claim 30, wherein said organic operational element includes a means for erasing the input-output relationship of the operation by an applied voltage so as to provide outputs responding to inputs repeatedly.

33. A plastic functional element as claimed in claim 31, wherein said organic operational element includes a means for erasing the input-output relationship of the operation by an applied voltage so as to provide outputs responding to inputs repeatedly.

34. A plastic functional element as claimed in claim 30, wherein said organic memory element is constructed and arranged such that a source electrode and a drain electrode are provided apart from each other, and in contact with, a plane of a contact surface between said first and second oxidation reduction material membranes, and includes a means for controlling the electron condition in at least one of the first and second oxidation reduction materials by applying a voltage between said source electrode and drain electrode.

35. A plastic functional element as claimed in claim 31, wherein said organic memory element is constructed and arranged such that a source electrode and a drain electrode are provided apart from each other, and in contact with, a plane of a contact surface between said first and second oxidation reduction material membranes, and includes a means for controlling the electron condition in at least one of the first and second oxidation reduction materials by applying a voltage between said source electrode and drain electrode.

36. A plastic functional element as claimed in claim 32, wherein said organic memory element is constructed and arranged such that a source electrode and a drain electrode are provided apart from each other, and in contact with, a plane of a contact surface between said first and second oxidation reduction material membranes, and includes a means for controlling the electron condition in at least one of the first and second oxidation reduction materials by applying a voltage between said source electrode and drain electrode.

37. A plastic functional element as claimed in claim 30, wherein in said organic operational element, a plurality of said first and second oxidation reduction material membranes is laminated alternately.

38. A plastic functional element as claimed in claim 31, wherein in said organic operational element, a plurality of said first and second oxidation reduction material membranes is laminated alternately.

39. A plastic functional element as claimed in claim 32, wherein in said organic operational element, a plurality of said first and second oxidation reduction material membranes is laminated alternately.

40. A plastic functional element as claimed in claim 33, wherein in said organic operational element, a plurality of said first and second oxidation reduction material membranes is laminated alternately.

41. A plastic functional element as claimed in claim 34, wherein in said organic operational element, a plurality of said first and second oxidation reduction material membranes is laminated alternately.

42. A plastic functional element as claimed in claim 35, wherein in said organic operational element, a plurality of said first and second oxidation reduction material membranes is laminated alternately.

43. A plastic functional element as claimed in claim 36, wherein in said organic operational element, a plurality of said first and second oxidation reduction material membranes is laminated alternately.

44. A plastic functional element as claimed in claim 30, wherein in said organic operational element, at least one of said first and second oxidation reduction material membrane is a monomolecular membrane or a laminated monomolecular membrane prepared by Langmuir-Blodgett method.

45. A plastic functional element as claimed in claim 31, wherein in said organic operational element, at least one of said first and second oxidation reduction material membrane is a monomolecular membrane or a laminated monomolecular membrane prepared by Langmuir-Blodgett method.

46. A plastic functional element as claimed in claim 32, wherein in said organic operational element, at least one of said first and second oxidation reduction material membrane is a monomolecular membrane or a laminated monomolecular membrane prepared by Langmuir-Blodgett method.

47. A plastic functional element as claimed in claim 33, wherein in said organic operational element, at least one of said first and second oxidation reduction material membrane is a monomolecular membrane or a laminated monomolecular membrane prepared by Langmuir-Blodgett method.

48. A plastic functional element as claimed in claim 34, wherein in said organic operational element, at least one of said first and second oxidation reduction material membrane is a monomolecular membrane or a laminated monomolecular membrane prepared by Langmuir-Blodgett method.

49. A plastic functional element as claimed in claim 35, wherein in said organic operational element, at least one of said first and second oxidation reduction material membrane is a monomolecular membrane or a laminated monomolecular membrane prepared by Langmuir-Blodgett method.

50. A plastic functional element as claimed in claim 36, wherein in said organic operational element, at least one of said first and second oxidation reduction material membrane is a monomolecular membrane or a laminated monomolecular membrane prepared by Langmuir-Blodgett method.

51. A plastic functional element as claimed in claim 30, wherein in said organic operational element, at least one of said first and second oxidation reduction material membrane is a monomolecular membrane or a laminated monomolecular membrane prepared by vacuum evaporation method or organic ICB method.

52. A plastic functional element as claimed in claim 31, wherein in said organic operational element, at least one of said first and second oxidation reduction material membrane is a monomolecular membrane or a laminated monomolecular membrane prepared by vacuum evaporation method or organic ICB method.

53. A plastic functional element as claimed in claim 32, wherein in said organic operational element, at least one of said first and second oxidation reduction material membrane is a monomolecular membrane or a laminated monomolecular membrane prepared by vacuum evaporation method or organic ICB method.

54. A plastic functional element as claimed in claim 33, wherein in said organic operational element, at least one of said first and second oxidation reduction material membrane is a monomolecular membrane or a laminated monomolecular membrane prepared by vacuum evaporation method or organic ICB method.

55. A plastic functional element as claimed in claim 34, wherein in said organic operational element, at least one of said first and second oxidation reduction material membrane is a monomolecular membrane or a laminated monomolecular membrane prepared by vacuum evaporation method or organic ICB method.

56. A plastic functional element as claimed in claim 35, wherein in said organic operational element, at least one of said first and second oxidation reduction material membrane is a monomolecular membrane or a laminated monomolecular membrane prepared by vacuum evaporation method or organic ICB method.

57. A plastic functional element as claimed in claim 36, wherein in said organic operational element, at least one of said first and second oxidation reduction material membrane is a monomolecular membrane or a laminated monomolecular membrane prepared by vacuum evaporation method or organic ICB method.

58. A plastic functional element as claimed in claim 30, in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of light irradiation and voltage application, and then by supplying input of a time changing voltage signal.

59. A plastic functional element as claimed in claim 31, plastic functional element is infinite real number differential integration circuit comprising in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of said light irradiation and voltage application, and then by supplying input of a time changing voltage signal.

60. A plastic functional element as claimed in claim 32, in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of light irradiation and voltage application, and then by supplying input of a time changing voltage signal.

61. A plastic functional element as claimed in claim 33, plastic functional element is infinite real number differential integration circuit comprising in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of said light irradiation and voltage application, and then by supplying input of a time changing voltage signal.

62. A plastic functional element as claimed in claim 34, in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of light irradiation and voltage application, and then by supplying input of a time changing voltage signal.

63. A plastic functional element as claimed in claim 35, plastic functional element is infinite real number differential integration circuit comprising in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of said light irradiation and voltage application, and then by supplying input of a time changing voltage signal.

64. A plastic functional element as claimed in claim 36, in combination with an RC circuit, to form an infinite real number differential integration circuit, including a means for providing an output of differential or integration operation of infinite real number rank with respect to time, by controlling the electron condition in at least one of the first and the second oxidation reduction materials with at least one of light irradiation and voltage application, and then by supplying input of a time changing voltage signal.

65. A plastic functional element as claimed in claim 2, in combination with an electric circuit, to form a chaos signal generating element which includes a means for generation and suppression of chaos signal by reacting to at least one of light irradiation and voltage application.

66. A plastic functional element as claimed in claim 3, plastic functional element is chaos signal generating element incorporating said organic in combination with an electric circuit, to form a chaos signal generating element which includes a means for generation and suppression of chaos signal by reacting to at least one of said light irradiation and voltage application.

67. A plastic functional element as claimed in claim 4, in combination with an electric circuit, to form a chaos signal generating element which includes a means for generation and suppression of chaos signal by reacting to at least one of light irradiation and voltage application.

68. A plastic functional element as claimed in claim 5, plastic functional element is chaos signal generating element incorporating said organic in combination with an electric circuit, to form a chaos signal generating element which includes a means for generation and suppression of chaos signal by reacting to at least one of said light irradiation and voltage application.

69. A plastic functional element as claimed in claim 6, in combination with an electric circuit, to form a chaos signal generating element which includes a means for generation and suppression of chaos signal by reacting to at least one of light irradiation and voltage application.

70. A plastic functional element as claimed in claim 7, plastic functional element is chaos signal generating element incorporating said organic in combination with an electric circuit, to form a chaos signal generating element which includes a means for generation and suppression of chaos signal by reacting to at least one of said light irradiation and voltage application.

71. A plastic functional element as claimed in claim 8, in combination with an electric circuit, to form a chaos signal generating element which includes a means for generation and suppression of chaos signal by reacting to at least one of light irradiation and voltage application.

72. A plastic functional element as claimed in claim 30, in combination with an electric circuit, to form a chaos signal generating element which includes a means for generation and suppression of chaos signal by reacting to at least one of light irradiation and voltage application.

73. A plastic functional element as claimed in claim 31, plastic functional element is chaos signal generating element incorporating said organic in combination with an electric circuit, to form a chaos signal generating element which includes a means for generation and suppression of chaos signal by reacting to at least one of said light irradiation and voltage application.

74. A plastic functional element as claimed in claim 32, in combination with an electric circuit, to form a chaos signal generating element which includes a means for generation and suppression of chaos signal by reacting to at least one of light irradiation and voltage application.

75. A plastic functional element as claimed in claim 33, in combination with an electric circuit, to form a chaos signal generating element which includes a means for generation and suppression of chaos signal by reacting to at least one of said light irradiation and voltage application.

76. A plastic functional element as claimed in claim 34, in combination with an electric circuit, to form a chaos signal generating element which includes a means for generation and suppression of chaos signal by reacting to at least one of light irradiation and voltage application.

77. A plastic functional element as claimed in claim 35, plastic functional element is chaos signal generating element incorporating said organic in combination with an electric circuit, to form a chaos signal generating element which includes a means for generation and suppression of chaos signal by reacting to at least one of said light irradiation and voltage application.

78. A plastic functional element as claimed in claim 36, in combination with an electric circuit, to form a chaos signal generating element which includes a means for generation and suppression of chaos signal by reacting to at least one of light irradiation and voltage application.

79. A plastic functional element as claimed in claim 65, in combination with an information processing system which employs said chaos signal generating element, and has capabilities of information searching function, memory function, and switching function using said chaos signal.

80. A plastic functional element as claimed in 66, in combination with an information processing system which employs said chaos signal generating element, and has capabilities of information searching function, memory function, and switching function using said chaos signal.

81. A plastic functional element as claimed in claim 67, in combination with an information processing system which employs said chaos signal generating element, and has capabilities of information searching function, memory function, and switching function using said chaos signal.

82. A plastic functional element as claimed in claim 68, in combination with an information processing system which employs said chaos signal generating element, and has capabilities of information searching function, memory function, and switching function using said chaos signal.

83. A plastic functional element as claimed in claim 69, in combination with an information processing system which employs said chaos signal generating element, and has capabilities of information searching function, memory function, and switching function using said chaos signal.

84. A plastic functional element as claimed in claim 70, in combination with an information processing system which employs said chaos signal generating element, and has capabilities of information searching function, memory function, and switching function using said chaos signal.

85. A plastic functional element as claimed in claim 71, in combination with an information processing system which employs said chaos signal generating element, and has capabilities of information searching function, memory function, and switching function using said chaos signal.

86. A plastic functional element as claimed in claim 72, in combination with an information processing system which employs said chaos signal generating element, and has capabilities of information searching function, memory function, and switching function using said chaos signal.

87. A plastic functional element as claimed in claim 73, in combination with an information processing system which employs said chaos signal generating element, and has capabilities of information searching function, memory function, and switching function using said chaos signal.

88. A plastic functional element as claimed in claim 74, in combination with an information processing system which employs said chaos signal generating element, and has capabilities of information searching function, memory function, and switching function using said chaos signal.

89. A plastic functional element as claimed in claim 75, in combination with an information processing system which employs said chaos signal generating element, and has capabilities of information searching function, memory function, and switching function using said chaos signal.

90. A plastic functional element as claimed in claim 76, in combination with an information processing system which employs said chaos signal generating element, and has capabilities of information searching function, memory function, and switching function using said chaos signal.

91. A plastic functional element as claimed in claim 77, in combination with an information processing system which employs said chaos signal generating element, and has capabilities of information searching function, memory function, and switching function using said chaos signal.

92. A plastic functional element as claimed in claim 78, in combination with an information processing system which employs said chaos signal generating element, and has capabilities of information searching function, memory function, and switching function using said chaos signal.

93. A plastic functional element as claimed in claim 2, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

94. A plastic functional element as claimed in claim 3, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

95. A plastic functional element as claimed in claim 4, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

96. A plastic functional element as claimed in claim 5, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

97. A plastic functional element as claimed in claim 6, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

98. A plastic functional element as claimed in claim 7, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

99. A plastic functional element as claimed in claim 8, wherein said plastic functional element includes an image memory element employing said organic memory element, and includes a means for utilizing a one-dimensional time-changing light pulse or a one-dimensional time-changing voltage pulse converted from image information being used as an input signal to said organic memory element.

100. A method for operating a device to manipulate data, said device including a first oxidation reduction material membrane having a first oxidation reduction potential and a second oxidation reduction material membrane having a second oxidation reduction potential that is different than said first oxidation reduction potential, wherein each membrane is in contact with one another and each membrane includes an alterable electron condition which can represent data within one of said first and second membranes, said method comprising the steps of:

applying a stimulus to at least one of said first and second oxidation reduction material membranes;

changing the electron condition within at least one of said first and second membranes to an altered state which defines data, in response to said stimulus;

removing said stimulus from said at least one membrane;

maintaining said altered state of said electron condition after removal of said stimulus; and reading out said altered state of said electron condition as data.

101. The method of claim 100, wherein:

said step of applying further includes applying said stimulus as a time changing signal to said at least one of said first and second oxidation reduction material membrane, wherein said membranes are sandwiched between first and second electrodes; and said step of reading out comprises applying a read stimulus to at least one of said first oxidation reduction material membrane and said second oxidation reduction material membrane, to read said altered state of said electron condition as data in a form of a signal that corresponds to said time changing signal.

102. The method of claim 100 wherein said stimulus is light irradiation.

103. The method of claim 100 wherein said stimulus is voltage application between a first electrode that is connected to said first oxidation reduction material membrane and a second electrode that is connected to said second oxidation reduction material membrane.

104. The method of claim 100, wherein the step of applying a stimulus includes applying a first stimulus, the method further comprising a steps of erasing said altered state of said electron condition by applying a second stimulus to at least one of said first and second membranes.

105. The method of claim 104 wherein said second stimulus is light irradiation.

106. The method of claim 104 wherein said second stimulus is voltage application between a first electrode that is connected to said first oxidation reduction material membrane and a second electrode that is connected to said second oxidation reduction material membrane.

107. The method of claim 100, further comprising the steps of:

controlling said stimulus applied to said membranes, so that said membranes provide chaos signals to an electronic circuit; and suppressing said chaos signals by further controlling said stimulus applied to said membranes.

108. The method of claim 107, further comprising the steps of:

performing information searching functions in response to said chaos signals;

performing memory functions in response to said chaos signals;

performing switching functions in response to said chaos signals.

109. The method of claim 100, further comprising the steps of:

controlling said stimulus applied to said membranes, so that said membranes in combination with an RC circuit, provide an integration operation of infinite real number rank with respect to time; and controlling said stimulus applied to said membranes, so that said membranes in combination with an RC circuit, provide an output differential operation of infinite real number rank with respect to time.

110. The method of claim 100, wherein said stimulus is a one-dimensional time-changing light pulse, and said method further comprises the steps of:

obtaining said stimulus from an image information input; and converting said stimulus applied to said membranes, such that said membranes provide input signals to an image memory element.

* * * * *